(12) United States Patent
Schluter et al.

(10) Patent No.: US 9,155,383 B2
(45) Date of Patent: Oct. 13, 2015

(54) RACK ASSEMBLY

(75) Inventors: Robert Schluter, Warwick, NY (US); Nico Corbo, Stroudsburg, PA (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 459 days.

(21) Appl. No.: 13/472,069

(22) Filed: May 15, 2012

(65) Prior Publication Data

US 2012/0292278 A1 Nov. 22, 2012

Related U.S. Application Data

(63) Continuation-in-part of application No. 13/403,510, filed on Feb. 23, 2012, now Pat. No. 9,131,622.

(60) Provisional application No. 61/486,600, filed on May 16, 2011, provisional application No. 61/493,040, filed on Jun. 3, 2011.

(51) Int. Cl.
*A47B 47/00* (2006.01)
*A47B 96/06* (2006.01)
(Continued)

(52) U.S. Cl.
CPC ............... *A47B 47/027* (2013.01); *F16B 12/52* (2013.01); *H05K 7/183* (2013.01); *A47B 57/408* (2013.01); *A47B 96/1441* (2013.01); *Y10T 29/49826* (2015.01)

(58) Field of Classification Search
CPC ............... A47B 47/027; A47B 57/408; A47B 96/1441; H05K 7/18; H05K 7/183; F16B 12/52

USPC ................. 211/26, 182, 183, 189; 312/265.1, 312/265.2, 265.4; 403/219, 292, 295
See application file for complete search history.

(56) References Cited

U.S. PATENT DOCUMENTS 993,491 A * 5/1911 Wiselogel ...................... 211/134
1,364,821 A * 1/1921 McCall ......................... 403/219
(Continued)

FOREIGN PATENT DOCUMENTS

CA 2235657 11/1998
DE 3404349 A1 * 8/1985
(Continued)

OTHER PUBLICATIONS

European Search Report and European Search Opinion, Jan. 13, 2013, EPO, 5 pages.

*Primary Examiner* — Stanton L Krycinski
(74) *Attorney, Agent, or Firm* — Drinker Biddle & Reath LLP

(57) ABSTRACT

A rack assembly includes a base frame having a base member, a lateral brace along a first edge of the base member, and a vertical stub extending upward from a corner of the base member, the vertical stub including first and second stub walls oriented substantially perpendicularly to each other; a side frame including a generally U-shaped vertical bracket; and a generally U-shaped gusset having an upper portion and a lower portion in which the one gusset wall is substantially parallel to and offset with respect to the upper portion. The upper portion of the gusset is attached to the vertical bracket so as to form a first gap between the one gusset wall and a corresponding vertical bracket wall, and a second gap is formed between another bracket wall and the lower portion of the corresponding gusset wall, the gaps being adapted to receive the vertical stub walls.

23 Claims, 13 Drawing Sheets

(51) Int. Cl.
  *A47B 47/02* (2006.01)
  *F16B 12/52* (2006.01)
  *H05K 7/18* (2006.01)
  *A47B 57/40* (2006.01)
  *A47B 96/14* (2006.01)

(56) References Cited

U.S. PATENT DOCUMENTS

| | | | | |
|---|---|---|---|---|
| 2,058,263 A | * | 10/1936 | Rosendale | 312/265.4 |
| 2,208,227 A | * | 7/1940 | Page | 52/280 |
| 2,485,172 A | * | 10/1949 | Rau et al. | 403/219 |
| 3,265,419 A | | 8/1966 | Durnbaugh et al. | 403/219 |
| 3,275,394 A | * | 9/1966 | Massinger | 312/265.4 |
| 3,305,255 A | * | 2/1967 | Henderson | 403/219 |
| 3,353,854 A | * | 11/1967 | Hansen | 403/171 |
| 3,919,603 A | * | 11/1975 | Salvati et al. | 361/605 |
| 3,981,251 A | * | 9/1976 | Damberg | 108/154 |
| 4,114,336 A | * | 9/1978 | Bechet et al. | 52/280 |
| 4,361,369 A | * | 11/1982 | Zwillich | 312/257.1 |
| 4,564,111 A | * | 1/1986 | Suttles | 211/189 |
| 4,782,637 A | * | 11/1988 | Eriksson et al. | 52/280 |
| 4,869,380 A | * | 9/1989 | Metcalfe et al. | 211/189 |
| 4,900,108 A | * | 2/1990 | Tischer | 312/265.3 |
| 4,948,203 A | * | 8/1990 | Amstutz et al. | 312/140 |
| 5,440,844 A | * | 8/1995 | Chihara et al. | 52/280 |
| 5,498,073 A | * | 3/1996 | Charbonneau et al. | 312/257.1 |
| 6,036,290 A | * | 3/2000 | Jancsek et al. | 312/265.4 |
| 6,205,738 B1 | * | 3/2001 | Chen | 52/653.2 |
| 6,238,029 B1 | * | 5/2001 | Marzec et al. | 312/265.3 |
| 6,379,074 B1 | * | 4/2002 | Chin et al. | 403/231 |
| 6,471,434 B2 | * | 10/2002 | Chin et al. | 403/175 |
| 6,561,603 B2 | * | 5/2003 | Knab et al. | 312/265.4 |
| 7,334,377 B2 | * | 2/2008 | Dubensky et al. | 52/780 |
| 7,855,885 B2 | * | 12/2010 | Adducci et al. | 361/692 |
| 7,967,157 B2 | * | 6/2011 | Bilotto | 211/194 |
| 8,091,970 B2 | * | 1/2012 | Francisquini | 312/265.1 |
| 2003/0214205 A1 | * | 11/2003 | Wyatt et al. | 312/265.4 |
| 2009/0283488 A1 | | 11/2009 | McMillan, III et al. | |
| 2010/0193754 A1 | | 8/2010 | Garza et al. | |

FOREIGN PATENT DOCUMENTS

| | | | | |
|---|---|---|---|---|
| EP | 538045 A1 | * | 4/1993 | A47B 57/20 |
| FR | 1073524 A | * | 9/1954 | |
| WO | WO03084298 | | 10/2003 | |

* cited by examiner

RACK ASSEMBLY

RELATED APPLICATIONS

This application is related to and claims priority from U.S. Provisional Patent Application No. 61/486,600, filed on May 16, 2011, U.S. Provisional Patent Application No. 61/493,040, filed on Jun. 3, 2011; and U.S. patent application Ser. No. 13/403,510, filed on Feb. 23, 2012, the disclosures of which are incorporated herein by reference in their entireties.

FIELD OF THE INVENTION

The invention relates to a rack assembly for mounting electronic components, and in particular to a robust rack assembly that is easily assembled and uses less material and energy to produce than conventional rack assemblies.

BACKGROUND

Rack assemblies are commonly used for mounting electronic components such as computer, audio, and video equipment. Often, such rack assemblies are used in commercial settings in which they must be repeatedly assembled and disassembled to rearrange store displays or to move the rack assembly to another location such as for a trade show. However, many currently commercially available rack assemblies are heavy and awkward to move, and require the use of tools for assembly and disassembly. Additionally, to achieve the desired strength, such rack assemblies are often made from thick gage material, such as steel, and are sometimes welded and/or bolted together to ensure stability. Forming rack components, such as angle supports and beams, typically requires bending, casting, or extruding. The thicker the gage of material used in the operation, the more energy needed to form the component. Heavy gage materials also result in a heavy rack, which means higher fuel costs to ship.

Therefore, it is desirable to have a rack assembly that is lighter than conventional rack assemblies without sacrificing strength and stability, and that is easily assembled and disassembled without requiring the use of tools.

SUMMARY

An embodiment of a rack assembly is described having a base frame, a side frame, and a gusset. The base frame includes base member, a lateral brace extending substantially perpendicularly upward along a first edge of the base member, and a vertical stub extending substantially perpendicularly upward from a corner of the base member, the vertical stub including a first stub wall and a second stub wall oriented substantially perpendicularly to each other at the corner of the base frame. The side frame includes a vertical bracket having a first bracket wall and a second bracket wall extending substantially perpendicularly along an edge of the first bracket wall. The gusset has a first gusset wall and a second gusset wall extending substantially perpendicularly along an edge of the first gusset wall, the gusset having an upper portion and a lower portion in which the second gusset wall is substantially parallel to and offset from the second gusset wall in the upper portion, such that when the upper portion of the second gusset wall is attached to the vertical bracket so as to form a first gap between the first gusset wall and the first bracket wall of the vertical bracket for receiving one of the stub walls of the vertical stub of the base frame, a second gap is formed between the second bracket wall and the lower portion of the second gusset wall for receiving the other of the stub walls of the vertical stub of the base frame. The base frame, the side frame, and the gusset are adapted to be assembled together to form a corner of the rack assembly in which a bottom end of the gusset rests on the base member of the base frame, and the vertical stub of the base frame is received into the first and second gaps between the side frame vertical bracket and the lower portion of the gusset.

In one variation, the rack assembly further includes a horizontal frame member extending laterally from a lower portion of the first bracket wall of the vertical bracket of the side frame, a support bracket extending perpendicularly upward along a second edge of the base member of the base frame, the second edge being substantially perpendicular to the first edge, and a reinforcing bracket having an upper portion and a lower portion substantially parallel to and offset with respect to the upper portion. When the upper portion of the reinforcing bracket is attached to the horizontal frame member, a gap is formed between the lower portion of the reinforcing bracket and the horizontal frame member for receiving the support bracket of the base frame.

In another variation, the vertical bracket may further include a third bracket wall extending substantially perpendicularly along an edge of the second bracket wall and located opposite and substantially parallel to the first bracket wall, such that the vertical bracket forms a generally U-shaped channel. Also, the gusset may further include a third gusset wall extending substantially perpendicularly along an edge of the second gusset wall and located opposite and substantially parallel to the first gusset wall, such that the gusset forms a generally U-shaped channel. When the base frame, the side frame, and the gusset are assembled together, the third gusset wall extends below an end of the third bracket wall and contacts one or both of the base member and the lateral brace of the base frame.

Another embodiment of a rack assembly is described having a base frame, a pair of side frames, four gussets, and a pair of reinforcing brackets. The base frame includes a base member having a substantially rectangular shape and a pair of lateral braces located on opposite edges of the base member, each lateral brace having a lateral wall extending substantially perpendicularly upward from the base member, a top wall extending substantially perpendicularly from the lateral wall so as to be substantially parallel to and positioned opposed to at least a portion of the base member, and a lip extending substantially perpendicularly from the top wall and toward the base member. The base frame further includes four vertical stubs, including a vertical stub extending substantially perpendicularly upward from each corner of the base member, each vertical stub including a first stub wall and a second stub wall bent substantially perpendicularly along an edge of the first stub wall. The base frame also includes a pair of support brackets located on opposite edges of the base member and substantially perpendicular to the pair of lateral braces, each support bracket extending perpendicularly upward from the base member. Each side frame includes a horizontal frame member extending laterally between lower portions of two vertical brackets, each vertical bracket having a first bracket wall, a second bracket wall extending substantially perpendicularly along an edge of the first bracket wall, a third bracket wall extending substantially perpendicularly along an edge of the second bracket wall and located opposite and substantially parallel to the first bracket wall such that the vertical bracket forms a generally U-shaped channel. Each gusset has a first gusset wall, a second gusset wall extending substantially perpendicularly along an edge of the first gusset wall, and a third gusset wall extending substantially perpendicularly along an edge of the second gusset wall and located opposite and substantially parallel to the first gusset wall, such that the gusset forms a generally U-shaped channel, the gusset having an upper portion and a lower portion in which the second gusset wall is substantially parallel to and offset from the second gusset wall in the upper portion, such that when the upper portion of the second gusset wall is attached to a corresponding vertical bracket so as to form a first gap between the first gusset wall and the first bracket wall of the vertical bracket for receiving one of the stub walls of a corresponding vertical stub of the base frame, a second gap is formed between the second bracket wall and the lower portion of the second gusset wall for receiving the other of the stub walls of the corresponding vertical stub of the base frame. Each reinforcing bracket has an upper portion and a lower portion substantially parallel to and offset with respect to the upper portion. The base frame, the side frames, and the gussets are adapted to be assembled together to form the rack assembly having four corners, wherein in each corner a bottom end of the gusset rests on the base member of the base frame, and the wherein vertical stub of the base frame is received into the first and second gaps between the side frame vertical bracket and the lower portion of the gusset. When the upper portion of each reinforcing bracket is attached to a corresponding horizontal frame member, a gap is formed between the lower portion of the reinforcing bracket and the horizontal frame member for receiving a corresponding support bracket of the base member. When the base frame, the side frames, and the gussets are assembled together, the third gusset wall of each gusset extends below an end of the third bracket wall of the corresponding vertical bracket and contacts one or both of the base member and the corresponding lateral brace of the base frame.

In one variation, the rack assembly may further include a brush grommet mounted above one of the base frame lateral braces for facilitating passage of cabling from outside to inside the rack assembly. The brush grommet may include a support frame, a latch mechanism for removably securing the support frame to one of the vertical brackets, a plurality of flexible bristles, and a compression bar, wherein the compression bar is adapted to compress upper portions of the bristles against the support beam while allowing lower portions of the bristles to move freely as the bristles flex.

In another variation, the rack assembly may further include a cross rail extending between two adjacent vertical brackets, the cross rail including a structure for receiving at least one fixture for securing a component to the cross rail.

The structure in the cross rail for receiving at least one fixture may include a mounting portion having a longitudinal slot sized to capture the fixture and an enlarged opening in the longitudinal slot sized to permit installation and removal of the fixture into and from the slot, respectively.

Alternatively, or in addition, the structure in the cross rail for receiving at least one fixture may include a generally U-shaped mounting portion having a front panel, an outer leg, and an inner leg, the outer leg having a first opening sized to receive an anchor of the fixture, the inner leg having a second opening sized to receive a tab extending outwardly from an end of a body the anchor but to prevent passage of the body of the anchor, and the front panel having a hole aligned with the first and second openings so as to enable insertion of a fastener into a threaded hole in the body of the anchor to secure the fixture in the mounting portion.

Further alternatively, or in addition, the structure in the cross rail for receiving at least one fixture may include a mounting portion having an opening sized to receive a locking lever at an end of a rack rail.

In another variation, the rack assembly further includes a fixture having an anchor having a body, a tab extending outwardly from each end of the body, and a threaded hole through the body, and a fastener having a head and a threaded shank extending from the head, the threaded shank being configured to be received into the threaded hole in the anchor.

An embodiment of a method of assembling a rack assembly is disclosed. The method includes providing a base frame including a base member, a lateral brace extending substantially perpendicularly upward along a first edge of the base member, and a vertical stub extending substantially perpendicularly upward from a corner of the base member, the vertical stub including a first stub wall and a second stub wall extending substantially perpendicularly along an edge of the first stub wall, providing a side frame including a vertical bracket having a first bracket wall and a second bracket wall extending substantially perpendicularly along an edge of the first bracket wall, and providing a gusset having a first gusset wall and a second gusset wall extending substantially perpendicularly along an edge of the first gusset wall, the gusset having an upper portion and a lower portion in which the second gusset wall is substantially parallel to and offset from the second gusset wall in the upper portion. The method further includes attaching the upper portion of the second gusset wall to the vertical bracket so as to form a first gap between the first gusset wall and the first bracket wall of the vertical bracket for receiving one of the stub walls of the vertical stub of the base frame, thereby forming a second gap between the second bracket wall and the lower portion of the second gusset wall for receiving the other of the stub walls of the vertical stub of the base frame, and aligning the first and second stub walls of the vertical stub with the first and second gaps between the gusset and the vertical bracket, and moving one of the side frame and the base frame toward the other of the side frame and the base frame until the first and second stub walls of the vertical stub are inserted into the first and second gaps between the gusset and the vertical bracket sufficiently that the gusset contacts the base member of the base frame, thereby forming a corner of the rack assembly.

BRIEF DESCRIPTION OF DRAWINGS

For the purpose of illustrating the invention, there are shown in the drawings embodiments that are presently preferred; it being understood, however, that this invention is not limited to the precise arrangements and constructions particularly shown.

DETAILED DESCRIPTION

Figure 1A:
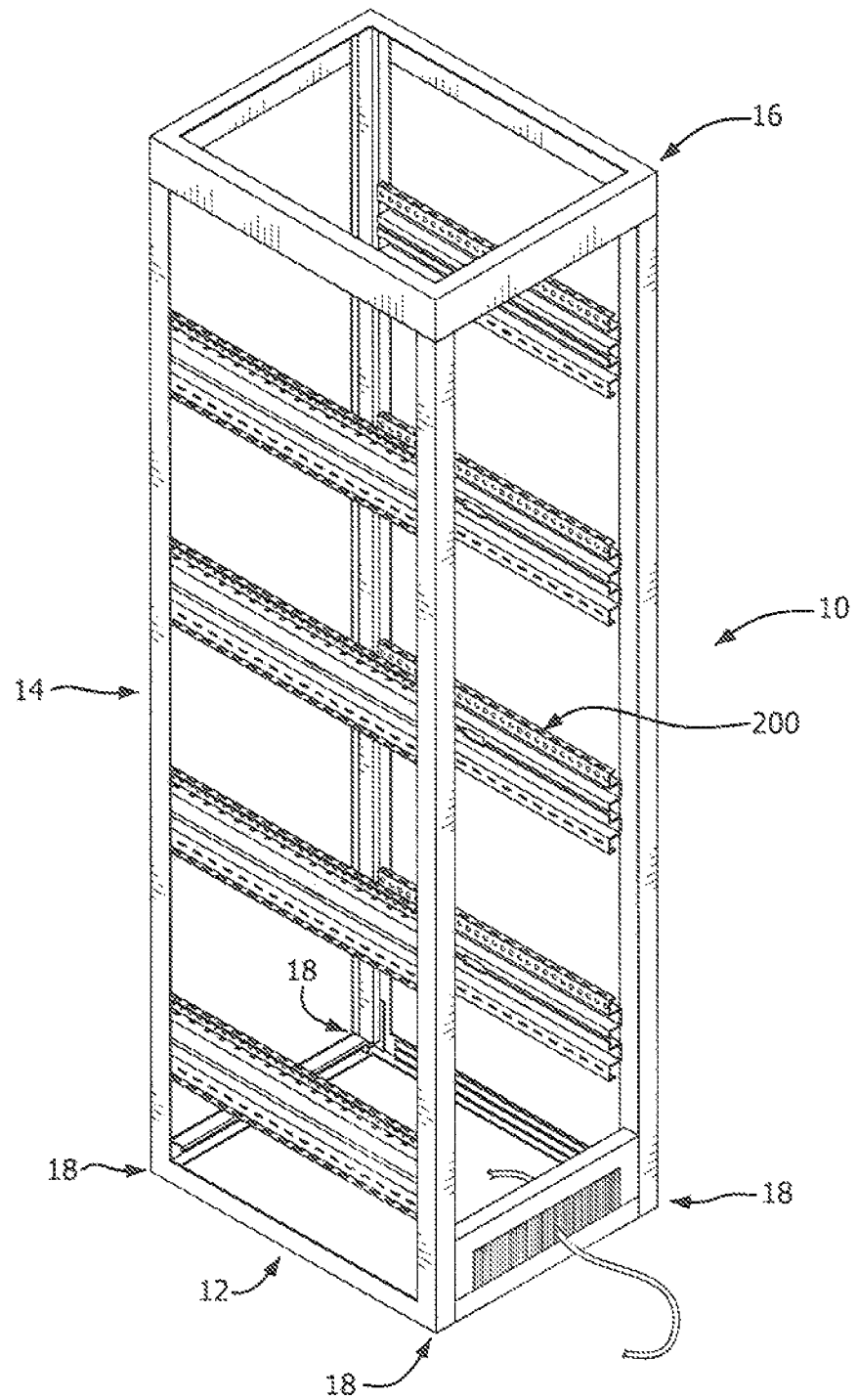
FIG. 1A is a perspective view showing an embodiment of a rack assembly.
Figure 1B:
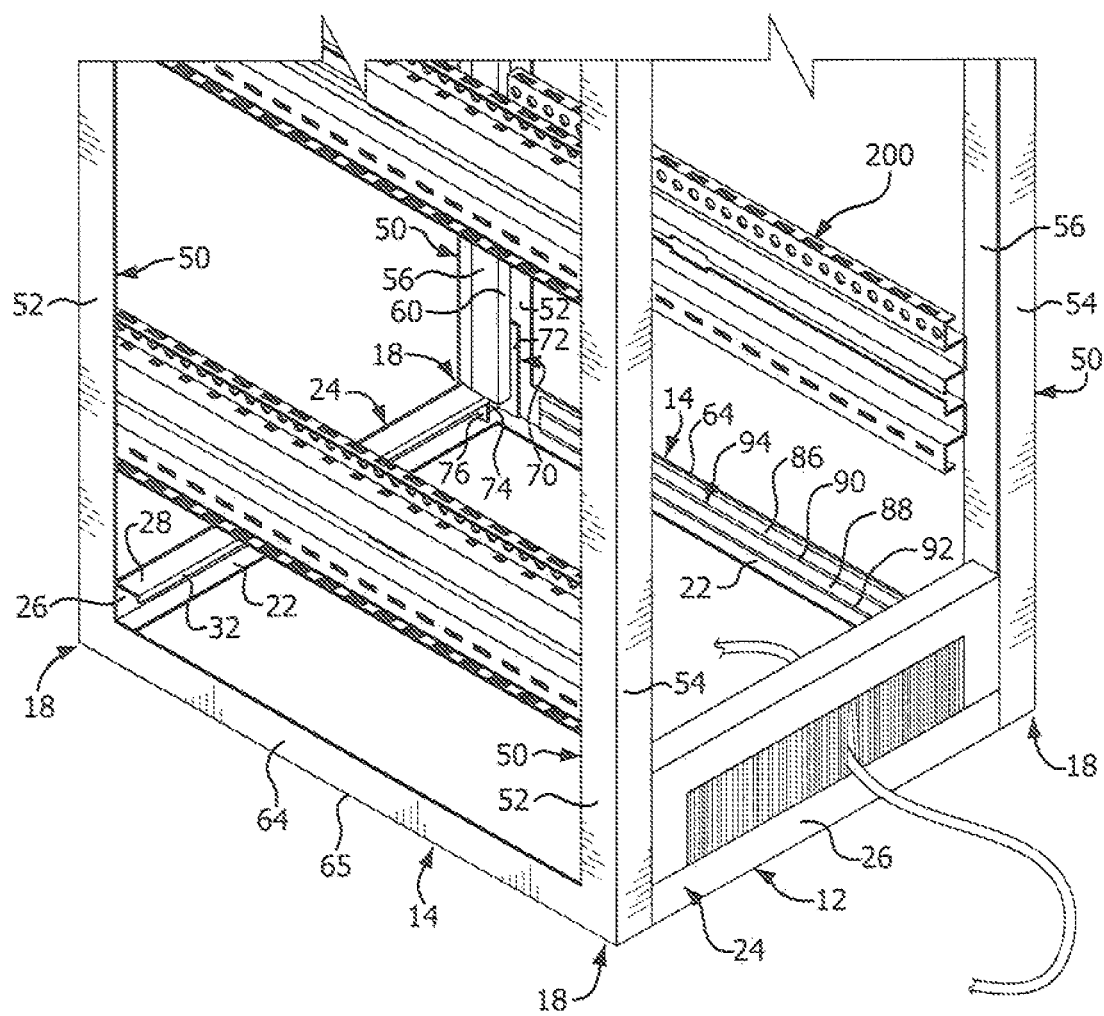
FIG. 1B is an expanded partial perspective view of the embodiment of a rack assembly of FIG. 1A, showing a lower portion of the rack assembly in detail.

An embodiment of a rack assembly 10 is shown in FIG. 1. The rack assembly 10 includes a base frame 12, two side frames 14, and a top frame 16. In use, the base frame 12 is supported by a substantially horizontal surface, such as a floor. The two side frames 14 are mounted to opposite sides of the base frame 12 and extend substantially vertically upward from the base frame 12. Each side frame 14 is joined to the base frame 12 at two corners 18. The top frame 16 is mounted on top of the side frames 14, and may be identical in structure to the base frame 12. The rack assembly 10 may include one or more cross-rails 200 extending between adjacent vertical rails of the rack assembly 10 for the mounting of various equipment to be supported by the rack assembly 10.

When describing the structure of the rack assembly 10, including the base frame 12, the side frames 14, the top frame 16, and the corners 18, positional terms such as inner or inward and outer or outward may be used for convenience to designate directions relative to the interior and exterior of a fully assembled rack assembly 10, it being understood that the component parts of the rack assembly 10 need not inherently have inner or outer directions when viewed as separate parts absent the context of the rack assembly 10.

Figure 2A:
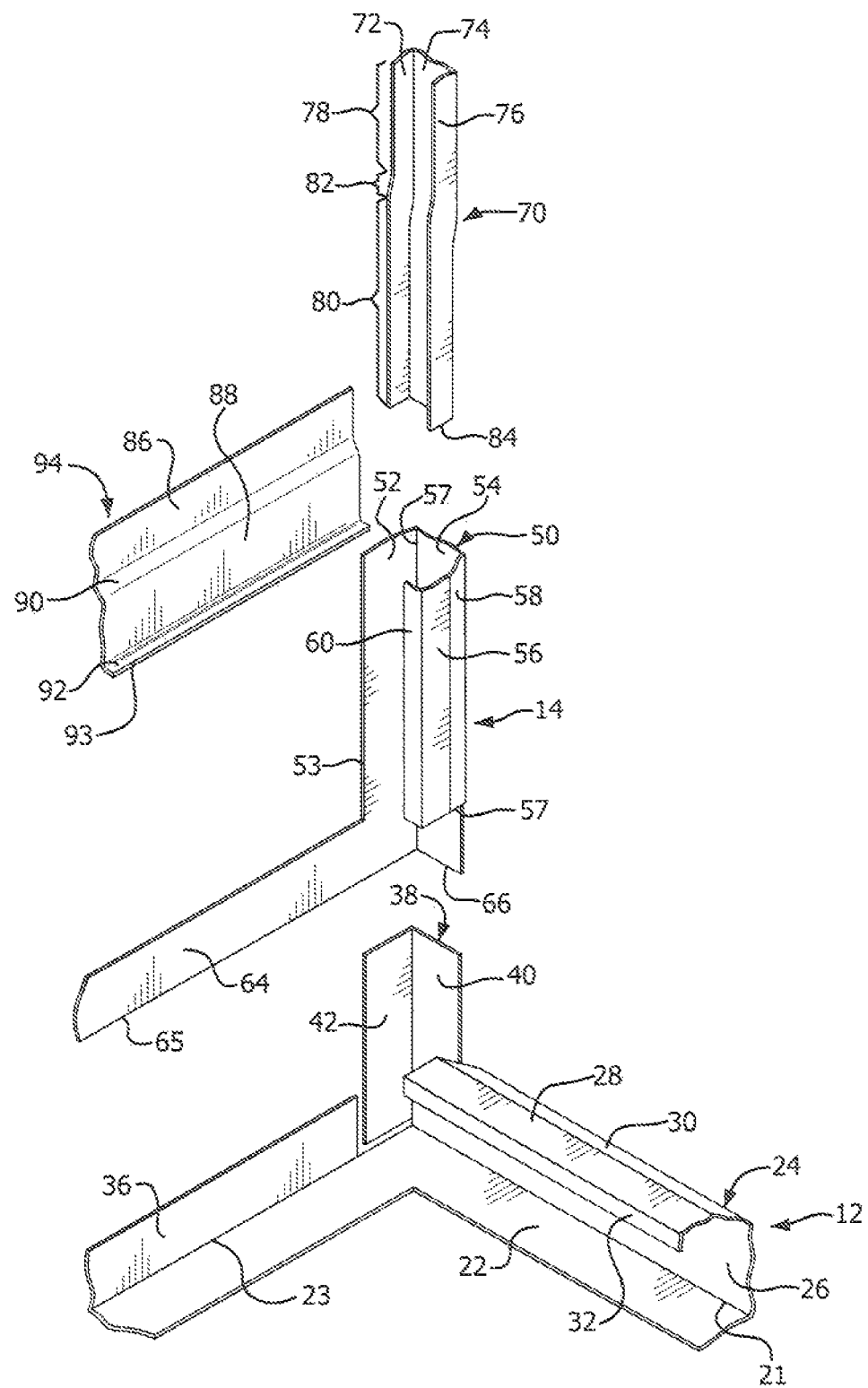
FIG. 2A is an exploded perspective view showing components of a base corner of the rack assembly in a disassembled state.
Figure 2B:
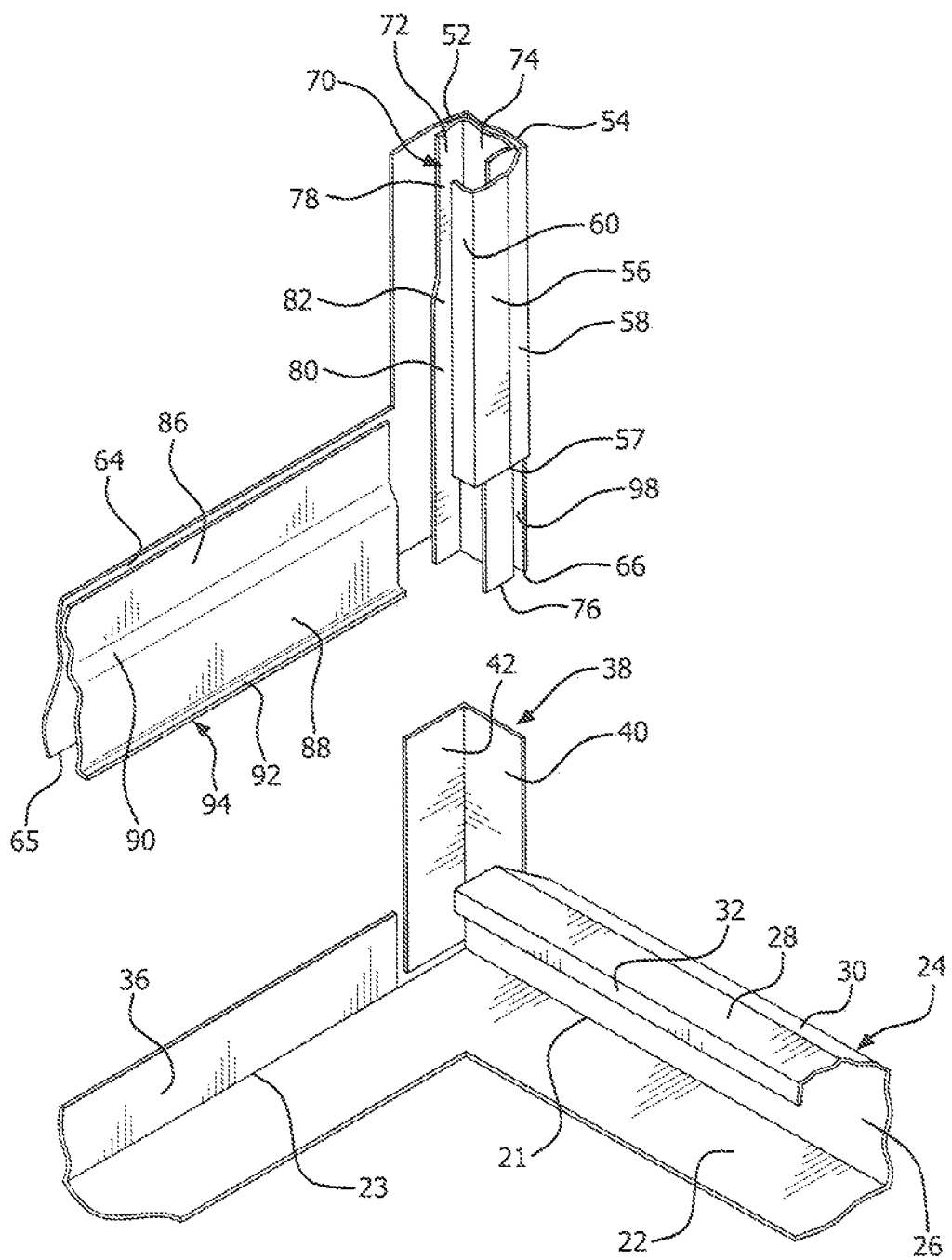
FIG. 2B is a partially exploded perspective view showing components of the base corner of FIG. 2A in a partially assembled state.
Figure 2C:
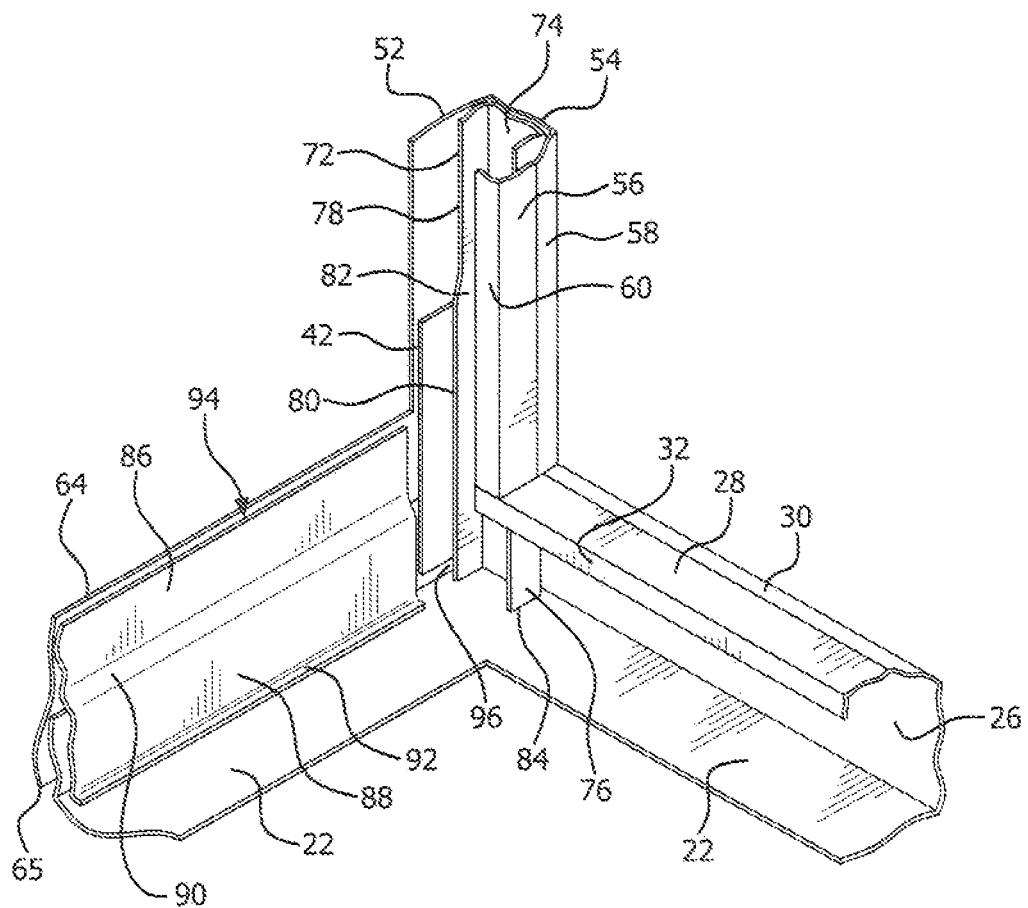
FIG. 2C is a perspective view showing components of the base corner of FIG. 2A in an assembled state.

The structure and assembly of the corner 18 is described with reference to FIGS. 2A-2C, which show an exemplary corner 18 in successive states of assembly. In the depicted embodiment, the base frame 12 includes a base member 22 having a substantially rectangular shape. The base member 22 can be in the form of a flat sheet of material, so as to enclose the bottom of the rack assembly 10. Alternatively, as shown, the base member 22 can be in the form of a strip of material bounding a rectangular opening so that the bottom of the rack assembly 10 can be open, or so that a separate bottom panel (not shown) can be used to enclose the bottom of the rack assembly 10.

A lateral brace 24 is integrally formed with the base member 22, preferably from the same sheet of material, to form an open channel shape. In the depicted embodiment, the lateral brace 24 includes a lateral wall 26 that is bent at an angle at or near a right angle with respect to a first edge 21 of the base member 22. The lateral wall 26 extends substantially perpendicularly upward from the base member 22. A sloped wall 30 is bent at an obtuse angle with respect to the lateral wall 26 so as to extend upwardly and inwardly from the lateral wall 26. A top wall 28 is bent at an obtuse angle with respect to the sloped wall 30, so that the top wall 28 extends substantially perpendicularly inward with respect to the lateral wall 26 and is positioned substantially parallel to and spaced apart from at least a portion of the base member 22. A lip 32 is bent to extend substantially perpendicularly downward from the top wall 28 and toward the base member 22. A slot 34 may be formed near an end of the top wall 28 near the corner 80.

A vertical stub 38 is integrally formed with the base member 22 at the corner 80, preferably from the same sheet of material, to form a structural angle. In the depicted embodiment, the vertical stub 38 includes a first stub wall 40 bent to extend substantially perpendicularly upward from the corner 80 along the edge 21 of the base member 22. The vertical stub 38 further includes a second stub wall 42 bent to extend substantially perpendicularly to the first stub wall 40 so as to be aligned with a second edge 23 of the base member 22, the second edge 23 being substantially perpendicular to the first edge 21.

A support bracket 36 is integrally formed with the base member 22, preferably from the same sheet of material. In the depicted embodiment, the support bracket 36 is bent to extend perpendicularly upward along the second edge 23 of the base member 22.

The side frame 14 includes a vertical bracket 50 formed in the shape of an open channel. In the depicted embodiment, the vertical bracket 50 has a first bracket wall 52 and a second bracket wall 54 that is bent at an angle at or near a right angle with respect to the first bracket wall 52. The second bracket wall 54 extends substantially perpendicularly along a first edge 51 of the first bracket wall 52. A sloped wall 58 is bent at an obtuse angle with respect to the second bracket wall 54 so as to extend inwardly from the second bracket wall 54. A third bracket wall 56 is bent at an obtuse angle with respect to the sloped wall 58, so that the third bracket wall 56 extends substantially perpendicularly inward with respect to the second bracket wall 54 and is positioned substantially parallel to and spaced apart from the first bracket wall 52. A lip 60 is bent to extend substantially perpendicularly outward from the third bracket wall 56 and toward the first bracket wall 52.

The third bracket wall 56 may include a tab 62 protruding downwardly from a bottom end 57 thereof. The tab 62 is adapted to be received into the slot 34 in the top wall 28 of the base frame lateral brace 24.

A horizontal frame member 64 extends laterally from a lower portion of the first bracket wall 52 and in the same plane as the first bracket wall 52. When the side frame 14 is assembled to the base frame 12, the horizontal frame member 64 is substantially aligned with the second edge 23 of the base member 22. The side frame 14 may further include a wall panel (not shown) adjoining and in the same plane as the horizontal frame member 64 and the first bracket wall 52 of the vertical bracket 50. It is contemplated that the wall panel may be formed integral with the frame member 64.

To provide for secure assembly of the side frame 14 to the base frame 12, a gusset 70, which may be in the form of a support channel, is attached to the side frame 14 for engaging at least the vertical stub 38 of the base frame 12. The gusset 70 includes a first gusset wall 74 and preferably a second gusset wall 72. The second gusset wall extends substantially perpendicularly along an edge of the first gusset wall 72. The gusset 70 may further include a third gusset wall 76 extending substantially perpendicularly along an edge of the second gusset wall 74 such that the third gusset wall 76 is located opposite and substantially parallel to the first gusset wall 72. In other words, the gusset 70 preferably forms a generally U-shaped support channel.

The gusset 70 has an upper portion 78 and a lower portion 80 that are joined by an intermediate portion 82. The lower portion 80 of the first gusset wall 74 is jogged from the upper portion 78 so that the lower portion is substantially parallel to and offset in an inwardly direction from the upper portion 78.

When assembled, the upper portion 78 of the first gusset wall 74 is attached to the second bracket wall 54 of the vertical bracket 50 so that a bottom end 84 of the gusset 70 is preferably substantially aligned with a bottom end 66 of the vertical bracket 50. The gusset 70 may be attached to the vertical bracket 50 by welding, brazing, bolting, or any other mechanism known in the art.

The upper portion 78 of the first gusset wall 74 is preferably attached to the second bracket wall 54 of the vertical bracket 50 in a position away from the junction or bend line between the first bracket wall 52 and the second bracket wall 54, thereby forming a first gap 96 between the second gusset wall 72 and the first bracket wall 52, The first gap 96 is sized to receive the second stub wall 42 of the vertical stub 38. Further, as a consequence of the offset between the upper portion 78 and the lower portion 80 of the gusset 70, a second gap 98 is formed between the second bracket wall 54 and the lower portion 80 of the second gusset wall 74. The second gap 98 is sized to receive the first stub wall 40 of the vertical stub 38.

Although gravity is typically sufficient to hold the side frame 14 to the base frame 12, through holes (not shown) may be provided in an aligned fashion in the gusset 70, the vertical stub 38, and the vertical bracket 50 for receipt of one or more bolts or pins or other removable securing mechanisms capable of holding the side frame 14 and base frame 12 together. More preferably, if additional rigidity is required, the components can be spot welded, thereby simplifying the manufacturing process and eliminating the weight associated with the additional fasteners.

To further secure the side frame 14 to the base frame 12, a reinforcing bracket 94 may be provided. In the depicted embodiment, the reinforcing bracket 94 has an upper portion 86 and a lower portion 88 that are joined by an intermediate portion 90. The lower portion 88 is substantially parallel to and offset in an inwardly direction with respect to the upper portion 86. The upper portion 86 of the reinforcing bracket 94 can be attached to the horizontal frame member 64 of the side frame 14 so that a bottom end 93 of the reinforcing bracket 94 is substantially aligned with a bottom end 65 of the horizontal frame member 64. The reinforcing bracket 94 can be attached to the horizontal frame member 64 by welding, brazing, bolting, or any other mechanism known in the art. As a consequence of the offset between the upper portion 86 and the lower portion 88 of the reinforcing bracket 94, a gap (not shown) is formed between the horizontal frame member 64 and the lower portion 88 of the reinforcing bracket 94. The gap is sized to receive the support bracket 36 of the base frame 12. The reinforcing bracket 94 may also include a flared end portion 92 to facilitate alignment of the gap with the support bracket 36 and the sliding of the support bracket 36 into the gap between the lower portion 88 of the reinforcing bracket 94 and the horizontal frame member 64 during assembly. The reinforcing bracket 94 may be secured to the base frame 12 by bolts or pins or other securing mechanism inserted into through holes (not shown) in the reinforcing bracket 94, the horizontal frame member 64, and the support bracket 36. More preferably, any desired securing may be accomplished through the use of spot welds.

Each component part of the rack assembly 10 is preferably made a material such as metal or plastic, including but not limited to ASTM A 1008 cold rolled steel sheet. The thickness of the primary frame components is preferably between about 0.028 inches and about 0.060 inches. This is considerably lighter than conventional racks which use steel with a thickness of between 0.078 inches and 0.125 inches. Thus, the present rack is substantially lighter than conventional racks, requiring less material. This means fabrication is less costly, requiring less energy to form the various components.

The base frame 12, the side frame 14, and the gusset 70 can be assembled together to form a corner 80 of the rack assembly 10. When assembled, the bottom end 84 of the gusset 70 rests on the base member 22 of the base frame 12, and the first and second stub walls 40, 42 of the vertical stub 38 of the base frame 12 are received into the first and second gaps 96, 98, respectively, between the side frame vertical bracket 50 and the lower portion 80 of the gusset 70. When the base frame 12, the side frame 14, and the gusset 70 are assembled together, the third gusset wall 76 extends below an end of the third bracket wall 56 and contacts one or both of the base member 22 and the lateral brace 24 of the base frame 12.

When the reinforcing bracket 94 is used and is attached to the horizontal frame member 64, the support bracket 36 of the base frame 12 is received into the gap between the lower portion 88 of the reinforcing bracket 94 and the horizontal frame member 64.

As disclosed herein, the rack assembly 10 can be readily assembled and disassembled without the need for tools, and when disassembled, the component parts can be packed in a relatively flat form for easy transport and storage. In addition, the interlocking nature of the assembly provides greater structural stability that conventional bolted designs, and enables the use of lighter gauge, thinner material for the base frame 12 and the side frame 14 than in conventional rack assemblies. Using lighter material provides several environmental benefits: less material inherently means less energy to produce and transport the material, and the energy requirements for painting and coating the components, which requires heating the material, is reduced in proportion to the reduced mass of the material. Lighter material is also easier for a user to handle when assembling, disassembling, and transporting the rack assembly 10 and its component parts. Yet the interlocking design disclosed herein provides sufficient rigidity that the rack assembly 10 has been shown to meet the most stringent seismic loading standards.

Figure 4A:
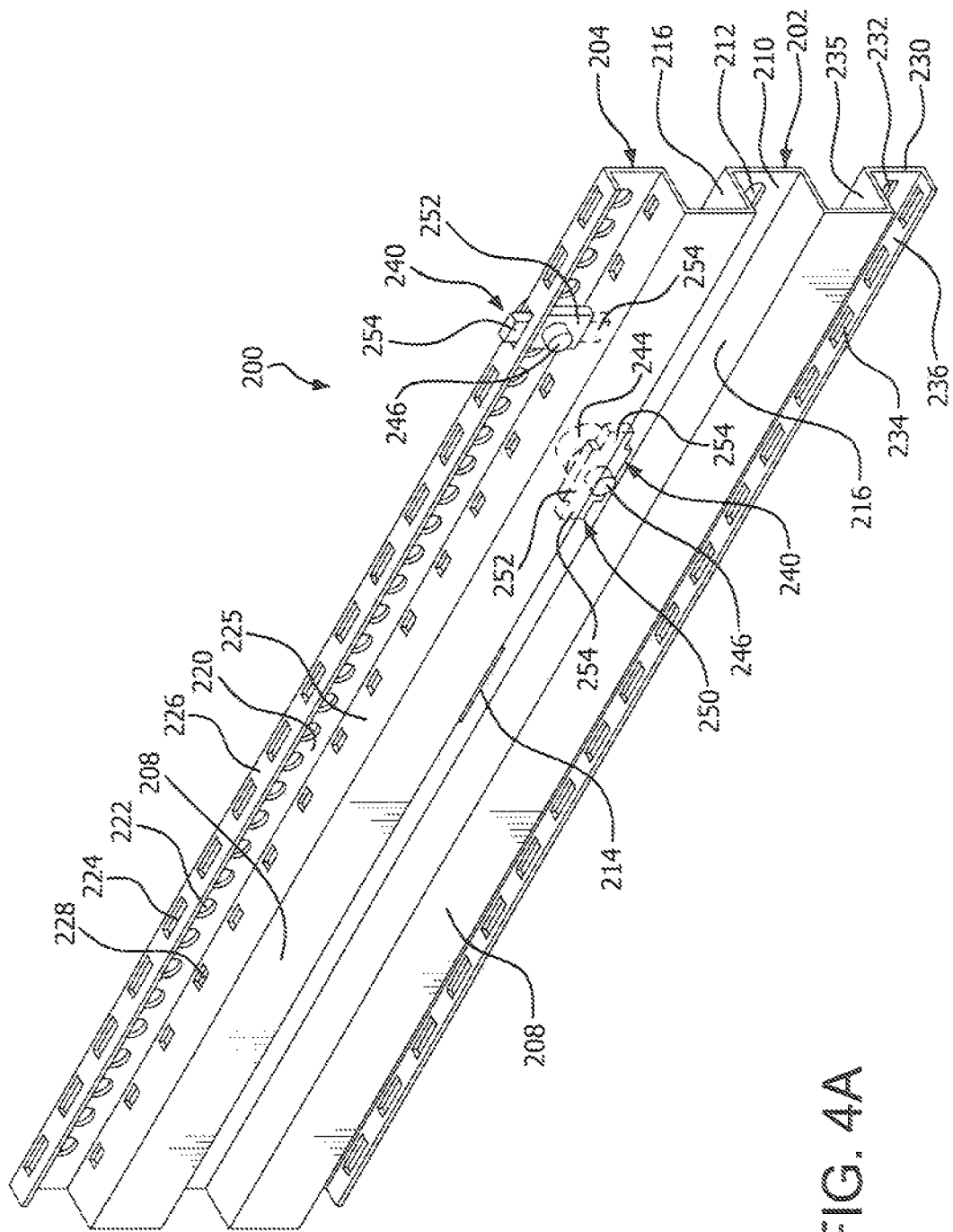
FIG. 4A is a rear perspective view of a rail configured to be mounted in a rack assembly and having mounting fixtures installed.
Figure 4B:
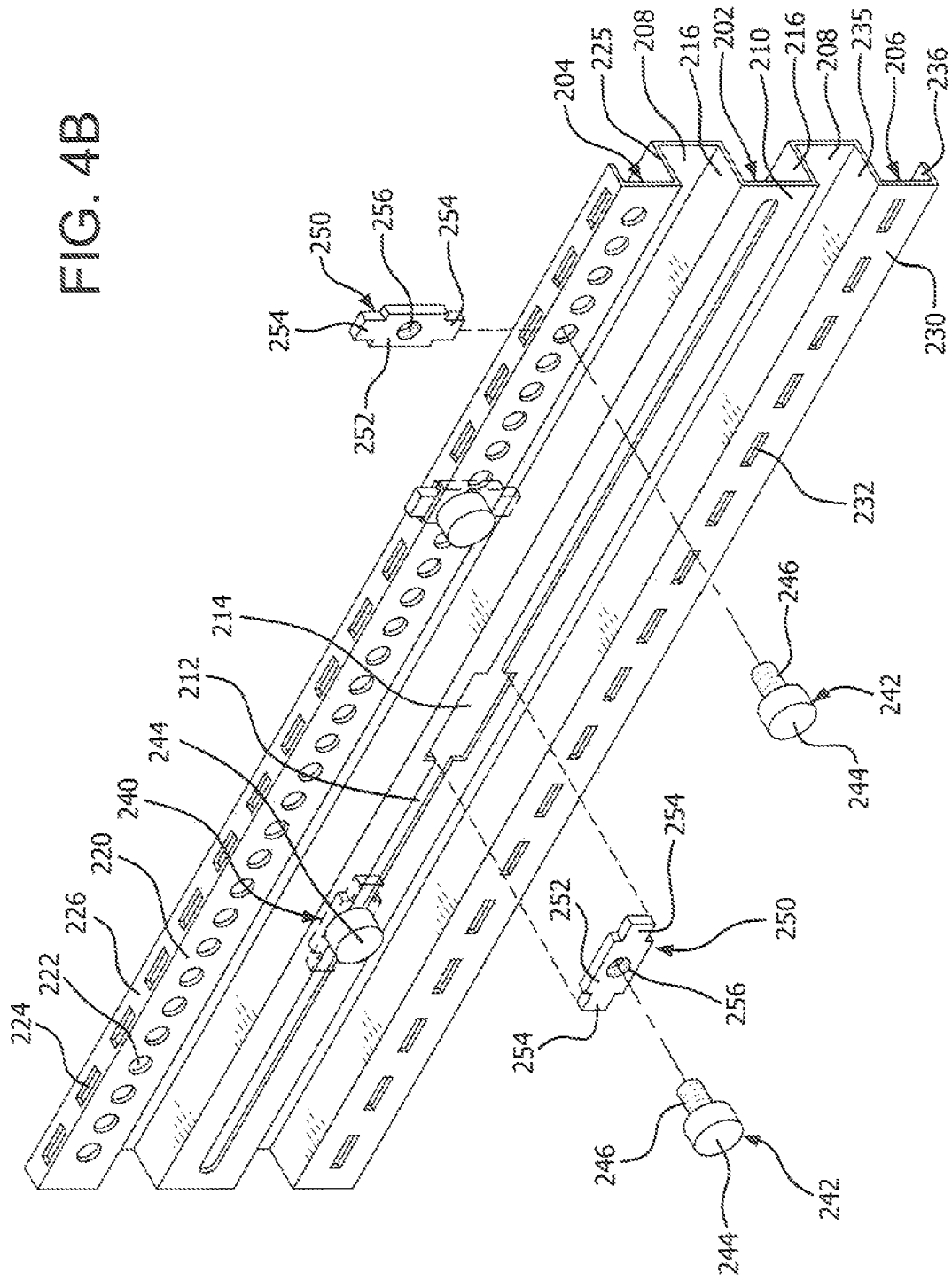
FIG. 4B is a front partially exploded perspective view of the rail of FIG. 4A showing exemplary fixtures removed and partially disassembled from the rail.

As shown in FIGS. 4A and 4B, the rail 200 is a versatile member that provides multiple mounting arrangements. The rail 200 is preferably affixed at its ends to two of the vertical brackets 50 of the rail assembly 10, and/or to a wall panel extending between two such vertical brackets 50. In the depicted embodiment, the rail 200 extends in a longitudinal direction and includes a first mounting portion 202, a second mounting portion 204 located on one side of the first mounting portion 202, and a third mounting portion 206 located on an opposite side of the first mounting portion 202. The first mounting portion 202 is joined to the second mounting portion 204 by a joining portion 208, and the first mounting portion 202 is joined to the third mounting portion 206 by another joining portion 208.

Viewed from an end of the rail 200, the rail 200 is preferably configured essentially in the form of a square wave or one or more channels. In one embodiment, the first mounting portion 202 is substantially U-shaped and includes a front panel 210 having leg panels 216 extending rearwardly therefrom on either side. The front panel 210 has a longitudinal slot 212 that runs nearly the entire length of the front panel 210, the slot 212 being closed at the ends. An enlarged opening 214 is provided in a middle portion of the slot 212 to enable insertion and removal of a mounting fixture 240, described in detail below. One of the joining panels 208 is connected to each of the leg panels 216.

The second mounting portion 204 is preferably substantially U-shaped, with one truncated leg, and includes a front panel 220, an inner leg panel 225, and an outer leg panel 226 that may extend a shorter distance from the front panel 220 than the inner leg panel 225. The front panel 220 includes a series of substantially circular openings 222 spaced substantially equally apart along the length of the front panel 220. The inner leg panel 225 includes a series of small substantially rectangular openings 228 spaced substantially equally apart along the length of the inner leg panel 225, and the outer leg panel 226 includes a series of larger substantially rectangular openings 224 spaced substantially equally apart along the length of the outer leg panel 226. In the depicted embodiment, the centerlines of the small openings 228 and the centerlines of the larger openings 224 are aligned with the centerlines every other circular opening 222, respectively, to enable receipt of a mounting fixture 240, described in detail below. The size difference between the small openings 226 and the larger openings 224 allows for installation and removal of the mounting fixture 240, as discussed more below. The inner leg 225 is connected to one of the joining panels 208 on one side of the first mounting portion 202.

The third mounting portion 206 is preferably substantially U-shaped, with one truncated leg, and includes a front panel 230, an inner leg panel 235, and an outer leg panel 236 that may extend a shorter distance from the front panel 230 than the inner leg panel 235. The front panel 230 includes a series of substantially rectangular openings 232 spaced substantially equally apart along the length of the front panel 230. The outer leg panel 236 includes a series of substantially rectangular openings 234 spaced substantially equally apart along the length of the outer leg panel 236 and aligned respectively with the openings 232. The openings 232 and 234, as well as the openings 224 in the outer leg 226 of the second mounting portion 204, are configured to receive a component or rack rail including locking lever, as described below. The inner leg 235 is connected to the other of the joining panels 208 on the opposite side of the first mounting portion 202 from the second mounting portion 204.

The mounting fixture 240 is configured to enable mounting of components in a variety of manners. In the depicted embodiment, the mounting fixture 240 includes a plus-shaped or t-shaped anchor 250 and a fastener 242 configured to engage the anchor 250 in a manner that allows the fastener 242 to be tightened and loosened. The anchor 250 includes a base 252, a tab 254 extending out from each end of the base 252, the tabs 254 being narrower in width than the base 252. An internally threaded hole 256 is located in the base 252. The fastener 242 includes a threaded shank 246 configured to be threaded into the hole 256 of the base 252, and a head 244 at one end of the shank 246 to enable the fastener 242 to be grasped and rotated by a user or a tool.

The mounting fixture 240 is installed into the first mounting portion 202 of the rail 202 by first threading the fastener 242 into the anchor 250. The anchor 250 is then inserted into the enlarged opening 214 of the slot 212 in the front panel 210 so that the anchor 250 is positioned behind the front panel 202, the head 244 of the fastener 242 remains in front of the front panel 202, and the shank 246 extends through the enlarged opening 214. The width of the enlarged opening 214 is at least as large as the width of the body 252 of the anchor 250, and the length of the enlarged opening 214 is at least as large as the length of the body 252. Next, the fixture 240 is slidingly moved along the slot 212 away from the enlarged opening 214. The width of the slot 212 is less than the width of the body 252 of the anchor 250, so that the anchor 250 cannot be removed from the slot 212 except by way of the enlarged opening 214. When the fixture 240 is positioned where desired, the fastener 242 is tightened by further threading the shank 246 into the hole 256 in the anchor 250 to secure the fixture 240 at that position along the slot 212. A component to be mounted, or a clip or bracket for mounting a component, can be positioned between the head 244 of the fastener 242 and the front panel 210 of the first mounting portion 202 prior to tightening the fastener 242. To move the fixture 240 to another location along the slot 212, the fastener 242 is simply loosened, the fixture 240 is slid along the slot 212 to the desired location, and the fastener 242 is then retightened.

The mounting fixture 240 may be installed into the second mounting portion 204 of the rail 200 by first separating the fastener 242 from the anchor 250. The anchor 250 is then inserted through one of the larger openings 224 in the outer leg 226 of the second mounting portion 204 until the tab 254 at one end of the body 252 extends into the corresponding small opening 228 in the inner leg 225 of the second mounting portion 204 and the body 252 abuts the inner leg 225 adjacent to the opening 228. The larger opening 224 has a width at least as large as the width of the body 252 of the anchor 250, to allow the body 252 to pass therethrough, while the small opening 228 has a width at least as large as the width of the tab 254 but smaller than the width of the body 252. When the anchor 250 is fully inserted into the openings 224, 228 as described above, the tab 254 at the opposite end of the body 252 remains protruding through the larger opening 224 and the threaded hole 256 in the anchor 250 is aligned with the corresponding circular hole 222 in the front panel 220 of the second mounting portion 204. A component to be mounted, or a clip or bracket for mounting a component, can be positioned between the head 244 of the fastener 242 and the front panel 220 of the second mounting portion 204 prior to tightening the fastener 242. The fastener 242 is used to secure the anchor 250 in position by inserting the shank 246 through the hole 222 and threading the shank 246 into the hole 256 in the anchor 250.

The third mounting portion 206 of the rail 200 is configured to receive an end of a rack rail having a locking lever, as described for example in U.S. patent application Ser. No. 13/403,510 filed Feb. 23, 2012, which is incorporated by reference herein in its entirety.

Figure 5:
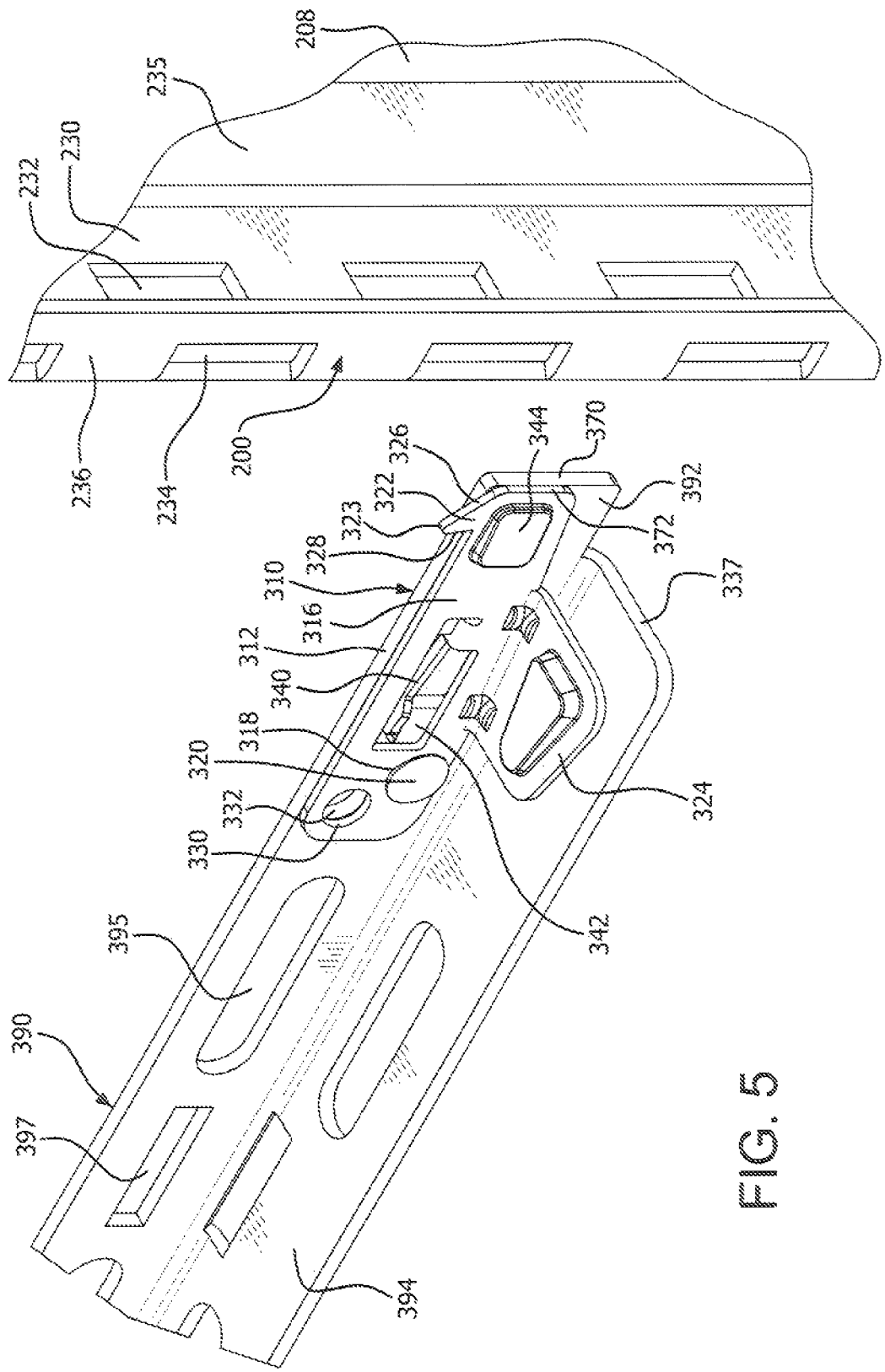
FIG. 5 is a perspective view showing a rack rail locking lever at one end of a rack rail.
Figure 6:
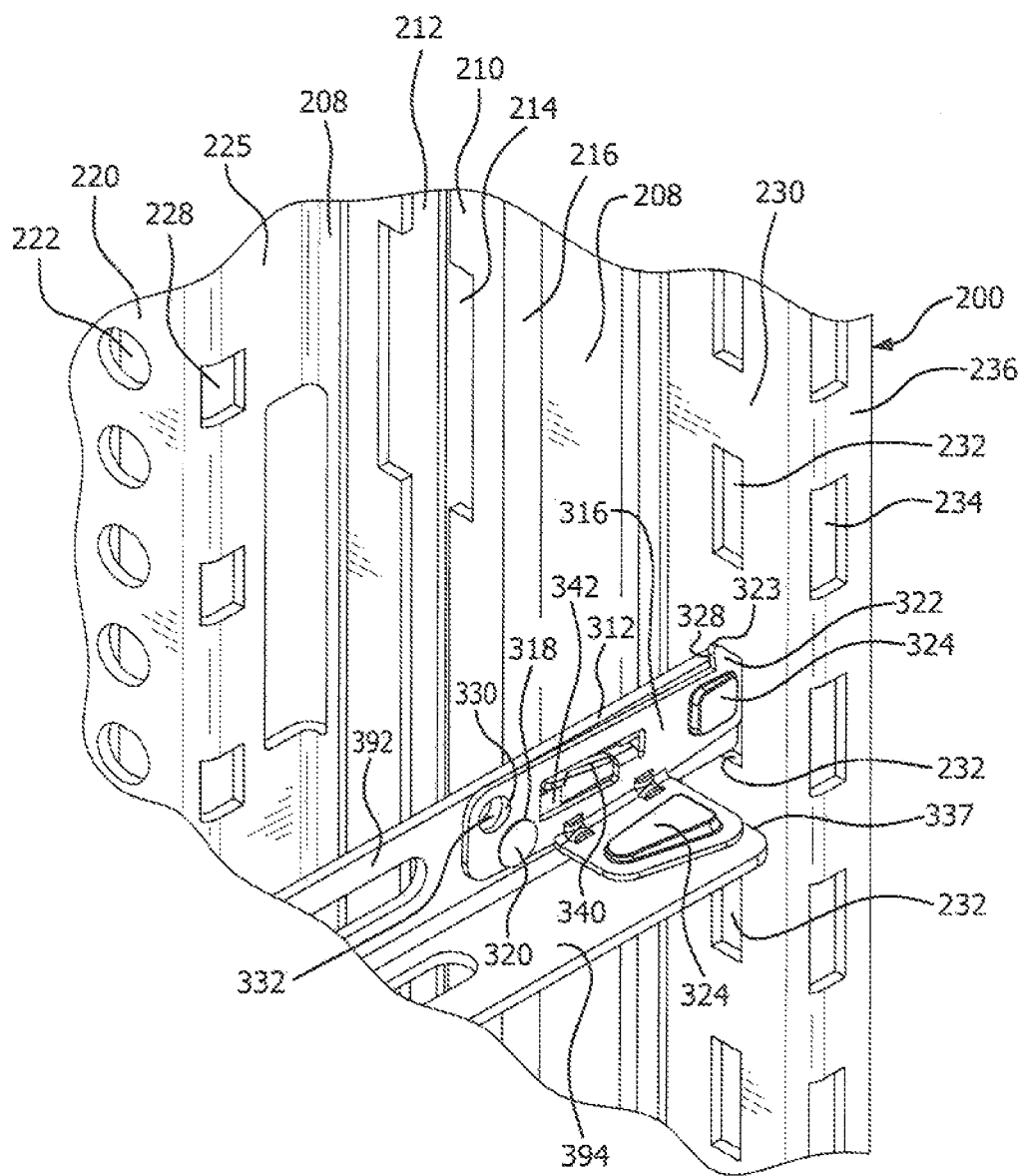
FIG. 6 is a perspective view showing the end of the rack rail of FIG. 5 partially inserted into a slot in a mounting rail of a rack assembly.

One embodiment of a locking lever 310 is shown in FIGS. 5 and 6 in conjunction with a rack rail 390. The rack rail 390 includes a side rail member 392 and a bottom rail member 394 preferably formed together in an angled or L-shaped cross-section. One or both of the side rail member 392 and the bottom rail member 394 may include slots 395, 397 that can be used to mount various components on the rack rail 390. An end insert (not shown) may be formed at one end of the rack rail 390, and the locking lever 310 is positioned at an opposite end of the rack rail 390. However, the locking lever 310 is not limited to such use, and may be used in conjunction with any rack-mountable component.

The locking lever 310 includes a base plate 312, which may be formed integrally with or be a portion of the side rail member 392, or may be rigidly affixed to an end of the side rail member 392. The locking lever 310 further includes a body plate 316 that is pivotably mounted with respect to the base plate 312. In the depicted embodiment, the body plate 316 is connected to the base plate 312 by a pivot pin or rivet 320 that is secured through an aperture 318 in the body plate 316. In the locking lever 310, an end portion of the base plate 312 extends longitudinally beyond an end wall 337 of the bottom rail member 394, and the longitudinally outer ends 370, 372 of the base plate 312 and the body plate 316, respectively, may be substantially aligned.

The body plate 316 includes a tang 322 that extends generally laterally outward in one direction at or near one of the longitudinal ends of the body plate 316, and at a distance from the pivot pin 320. In the depicted embodiment, the tang 322 has a distal tip 323 defined by a front sloped surface 326 and a rear slope surface 328, and is angled so that the tip 323 faces away from the outer end 370 of the body plate 316. The body plate 316 is pivotable about the pivot pin 320 with respect to the base plate 312 between a first position and a second position. The body plate 316 may include a raised tapered portion 344 on a face opposite the base plate 312 such that the width of the end portion of the locking lever 310 is about the same as the width of the openings 232, 234 on the mounting rail 200.

In the first position, the longitudinal direction of the body plate 316 is substantially parallel to the longitudinal direction of the base plate 312. In the first position, the combined lateral dimension (height in the illustrated embodiment) of the locking lever 310, including the base plate 312 and the body plate 316 with the tang 322, is at least slightly larger than the height of an opening 232, 234 in a mounting rail 200.

In the second position, the longitudinal direction of the body plate 316 is pivoted so as to be at an angle (skewed) with respect to the longitudinal direction of the base plate 312, which results in the tang 322 being at least partially retracted in the lateral direction with respect to the base plate 312. Therefore, in the second position, the combined lateral dimension of the locking lever 310, including the base plate 312 and the body plate 316 with the tang 322, is at least slightly smaller than the height of the opening 232, 234.

The locking lever 130 preferably includes a spring 340 to bias the body plate 316 toward the first position with respect to the base plate 312. In the depicted embodiment, the spring 340 is integrally formed with the body plate 316. For example, the spring 340 can be formed from a bent portion of the same flexible but resilient material (e.g., metal or plastic) from which the body plate 316 is made. Preferably, as shown in the embodiment of FIGS. 5 and 6, the spring 340 is bent out of the plane of the body plate 316 and extends generally parallel to the longitudinal direction of the body plate 316. One end of the spring 340 is attached to the body plate 316, and an opposite end of the spring 340 is movable by flexing the spring 340. The opposite end of the spring 340 contacts a spring pad 342 on the base member 312 in such a manner as to exert a spring force as the body plate 346 is pivoted out of the first position toward the second position (i.e., the spring biases the locking lever into the first position.) The spring pad 342 can be integrally formed as part of the base plate 312, or can be attached so as to be immovable with respect to the base plate 312.

To facilitate pivoting of the body plate 316 between the first and second positions with respect to the base plate 312, the body plate 316 may include a finger tab 324. In the depicted embodiment, the finger tab 324 is formed from the same piece of material as the body plate 316 and is bent over at approximately a right angle so as to extend in a direction away from a lower edge of the base plate 312. The finger tab 324 is located on the same side of the body plate 316 as the tang 322 with respect to the pivot pin 320, such that when the finger tab 324 is moved laterally toward the bottom rail member 394, the tang 322 pivots so as to be at least partially recessed in a lateral direction, and when the finger tab 324 is released, the force of the spring 340 causes the finger tab 324 to be pivoted laterally outward away from the bottom rail member 394 with respect to the base plate 312 and the tang 322 extends (protrudes) at least partially beyond the base plate 312 in a lateral direction.

Although a specific embodiment of a spring 340 is depicted in FIGS. 5 and 6, it is contemplated that any spring that biases the body plate 316 from the second position toward the first position could be employed. In particular, the spring 340 can operate in flexure as shown, or can be arranged to operate in compression or tension, depending on the location of the spring 340 with respect to the pivot pin 320 and the tang 322. For example, a spring located between the finger tab 324 and the bottom rail member 394, and located in the same direction from pivot pin 320 as the tang 322, would be in compression; however, a spring attached between the body plate 312 and the bottom rail member 394 or side rail member 392, and located in the opposite direction from the pivot pin 320 as the tang 322, would be in tension.

As the end portion of the locking lever 310 is inserted into an opening 232, 234, the front sloped surface 326 of the tang 322 contacts an edge of the opening 232, 234, forcing the body plate 316 to pivot toward the second position until the tip 323 passes through the slot, at which point the spring 340 causes the body plate 316 to snap back into the first position. Subsequently, if an attempt is made to remove the end portion of the locking lever 310 from the slot without actuating the body plate 316 by way of the finger tab 324, the tip 323 will contact the front panel 230 (or the outer leg 236) of the third mounting portion 206 of the rail 200 but will not allow the locking lever 310 to be pulled out of the slot. The rear sloped surface 318, by being undercut, prevents contact between the tang 322 and the front panel 230 (or the outer leg 236) from actuating the body plate 316 away from the first position toward the second position.

In one variation, as depicted, the base plate 312 includes a through hole 332, and the body plate 316 includes a through hole 330 that is aligned with the through hole 332 in the base plate 312 when the body plate 316 is in the first position. If desired, a securing device, such as a pin, safety strap or bolt can be inserted into the aligned through holes 330, 332 to prevent unintentional movement of the body plate 316 out of the first position.

Figure 7:
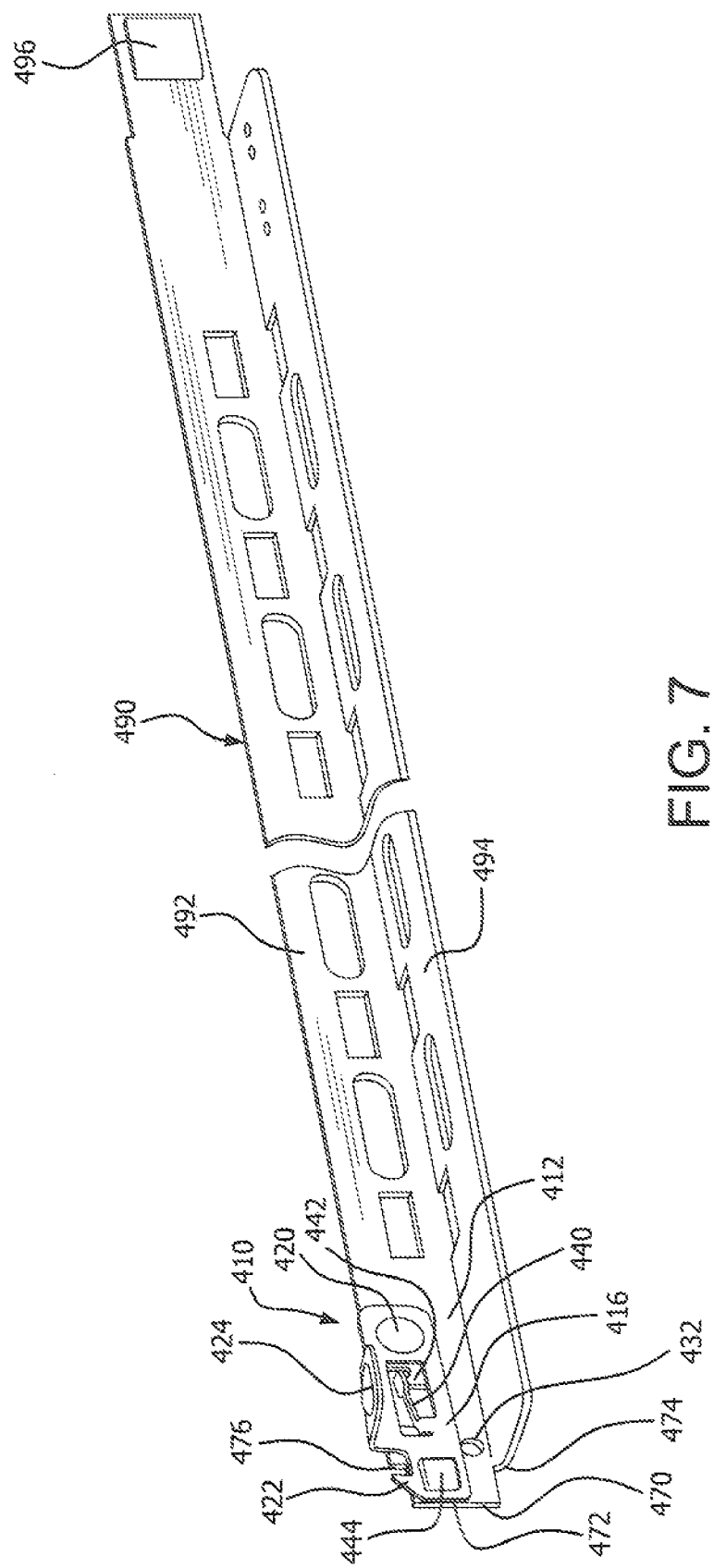
FIG. 7 is a side perspective view showing another type of rack rail locking lever at one end of a rack rail.
Figure 8:
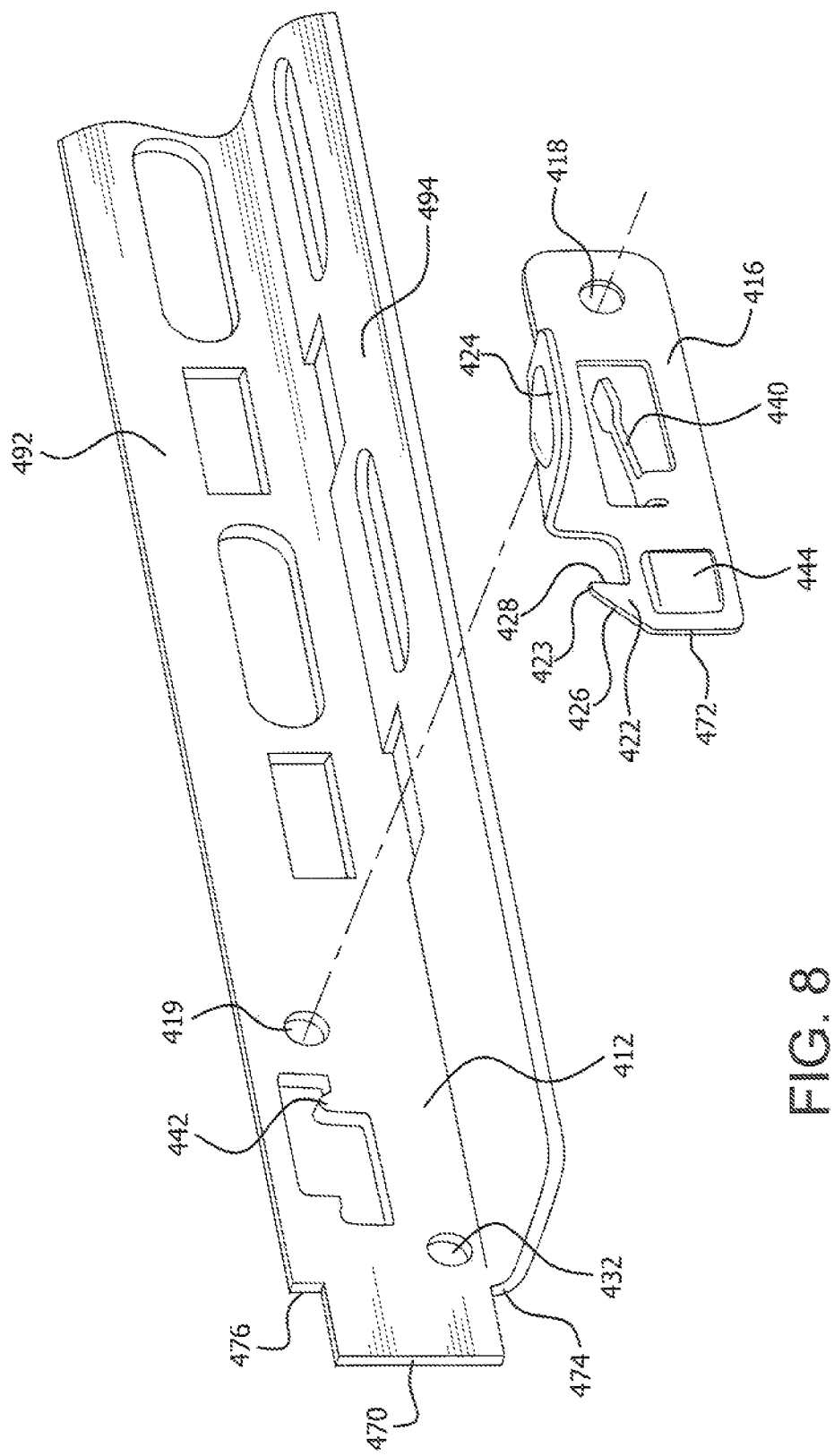
FIG. 8 is an exploded side perspective view of a portion of the rack rail locking lever of FIG. 7 showing the rack rail locking lever removed from the one end of the rack rail.

Another embodiment of a locking lever 410 is shown in FIGS. 7 and 8 in conjunction with a rack rail 490. An end insert 492 is formed at one end of the rack rail 490, and the locking lever 410 is located at the other end of the rack rail 490.

The locking lever 410 includes a base plate 412, which may be formed integrally with or be a portion of the rail 490, or may be rigidly affixed to an end of the rail 490 such as by welding or brazing. The locking lever 410 further includes a body plate 416 that is pivotably mounted with respect to the base plate 412. In the depicted embodiment, the body plate 416 is connected to the base plate 412 by a pivot pin or rivet 420 that is secured through an aperture 418 in the body plate 416 and an aperture 419 in the base plate 412. The base plate 412 has a longitudinally outer end 470 and is notched to have recessed end faces 474 and 476 below and above the end 470, respectively. The body plate 416 has an end 472 that may be substantially aligned with the end 470 of the base plate 412.

The body plate 416 includes a tang 422 that extends generally laterally outward in one direction at or near one of the longitudinal ends of the body plate 416, and at a distance from the pivot pin 420. In the depicted embodiment, the tang 422 has a distal tip 423 defined by a front sloped surface 426 and a rear surface 428, and is angled so that the tip 423 faces away from the outer end 470 of the body plate 416. The body plate 416 is pivotable about the pivot pin 420 with respect to the base plate 412 between a first position and a second position. The body plate 416 may include a raised tapered portion 444 on a face opposite the base plate 412 such that the width of the end portion of the locking lever 410 is about the same as the width of an opening 232, 234 on a rail 200.

As shown in the illustrated embodiment, in the first position, the longitudinal direction of the body plate 416 is substantially parallel to the longitudinal direction of the base plate 412. In the first position, the combined lateral dimension (height in the illustrated embodiment) of the locking lever 410, including the base plate 412 and the body plate 416 with the tang 422, is at least slightly larger than the height of an opening 232, 234 in a mounting rail 200.

In the second position, the longitudinal direction (or axis) of the body plate 416 is pivoted so as to be at an angle (skewed) with respect to the longitudinal (vertical) direction of the base plate 412, which results in the tang 422 being at least partially retracted in the lateral direction with respect to the base plate 412. Therefore, in the second position, the combined lateral dimension of the locking lever 410, including the base plate 412 and the body plate 416 with the tang 422, is at least slightly smaller than the height of the opening 232, 234. In particular, the combined height is approximately equal to the height of the end portion of the base plate 412 that terminates in the end 470, bounded by the recessed notches above and below.

As in the embodiment of FIGS. 5 and 6, the locking lever 410 preferably includes a spring 440 to bias the body plate 416 toward the first position with respect to the base plate 412. In the depicted embodiment, the spring 440 is integrally formed with the body plate 416. For example, the spring 440 can be formed from a bent portion of the same flexible but resilient material (e.g., metal or plastic) from which the body plate 416 is made. Preferably, the spring 440 is bent out of the plane of the body plate 416 and extends generally parallel to the longitudinal direction of the body plate 416. One end of the spring 440 is attached to the body plate 416, and an opposite end of the spring 440 is movable by flexing the spring 440. The opposite end of the spring 440 contacts a spring pad 442 on the base member 412 in such a manner as to exert a spring force as the body plate 416 is pivoted out of the first position toward the second position (i.e., the spring biases the locking lever into the first position.) The spring pad 442 can be integrally formed as part of the base plate 412, or can be attached so as to be immovable with respect to the base plate 412.

To install the rack rail 490 into an opening 232, 234 in a mounting rail 200, it is not necessary to manually actuate the locking lever 410 against the spring 440. In particular, as the end portion of the locking lever 410 is inserted into an opening 232, 234, the front sloped surface 426 of the tang 422 contacts an edge of the opening 232, 234, forcing the body plate 416 to pivot toward the second position until the tip 423 passes through the slot, at which point the spring 440 causes the body plate 416 to snap back into the first position. Subsequently, if an attempt is made to remove the end portion of the locking lever 410 from the slot without actuating the body plate 416 against the spring 440, the tip 423 will contact a rear face the mounting rail 200 but will not allow the locking lever 410 to be pulled out of the opening 232, 234. Any such rear surface is preferably configured to prevent contact between the tang 422 and the mounting rail 200 from actuating the body plate 416 away from the first position toward the second position.

For removal of the rack rail 490 from an opening 232, 234 in a mounting rail 200, the body plate 416 must be pivoted to the second position with respect to the base plate 412. To facilitate pivoting of the body plate 416 between the first and second positions with respect to the base plate 412, the body plate 416 may include a finger tab 424. In the depicted embodiment, the finger tab 424 is formed from the same piece of material as the body plate 416 and is bent over at approximately a right angle so as to extend in a direction away from an upper edge of the base plate 412. The finger tab 424 is located on the same side of the body plate 416 as the tang 422 with respect to the pivot pin 420, such that when the finger tab 424 is moved laterally downward, the tang 422 pivots so as to be at least partially recessed in a lateral direction, and when the finger tab 424 is released, the force of the spring 440 causes the finger tab 424 to be pivoted laterally upward and the tang 422 extends (protrudes) at least partially beyond the base plate 412 in a lateral direction.

In one variation, as depicted, the base plate 412 includes a through hole 432 located adjacent to an edge of the body plate 416. If desired, a securing device, such as a pin, safety strap or bolt can be inserted into the aligned through hole 432 to prevent unintentional movement of the body plate 416 out of the first position.

Figure 3A:
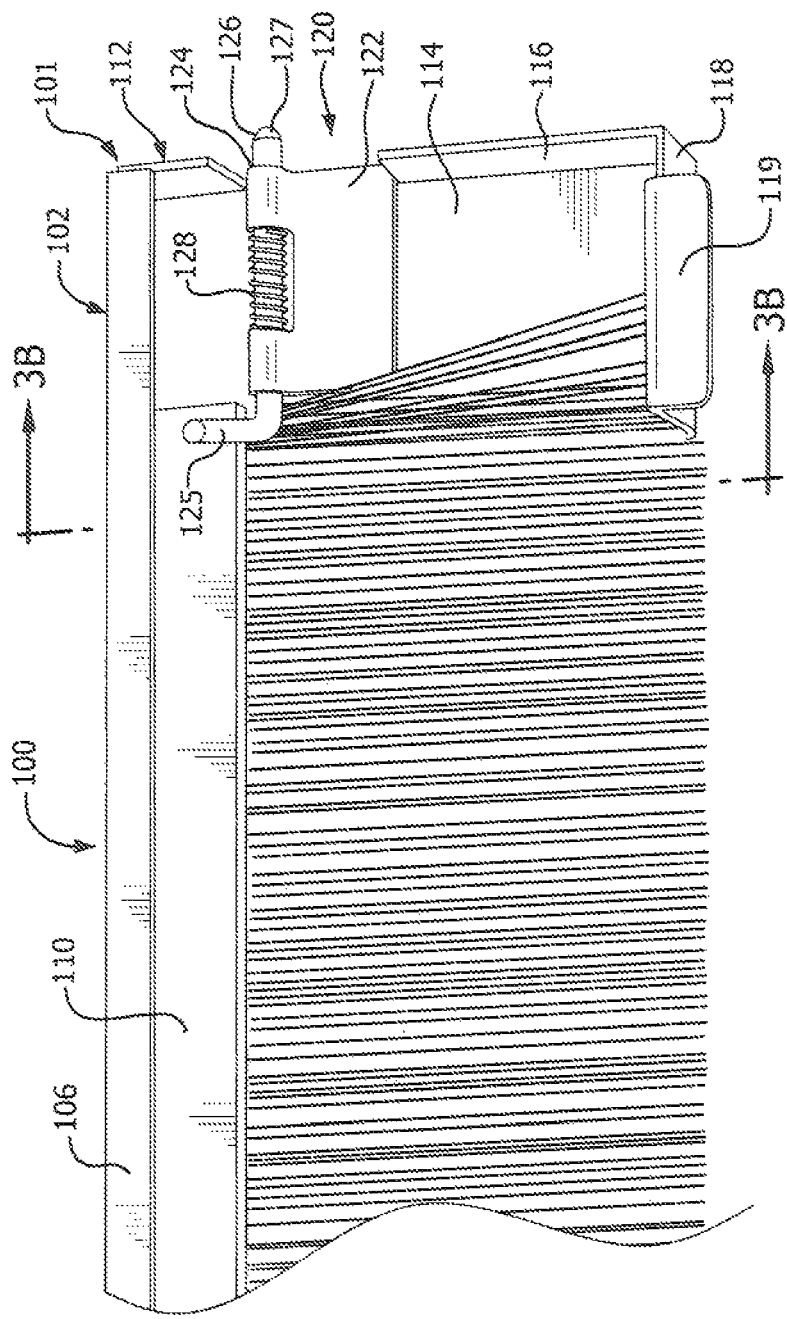
FIG. 3A is a side view of brush grommet for mounting in a rack assembly.
Figure 3C:
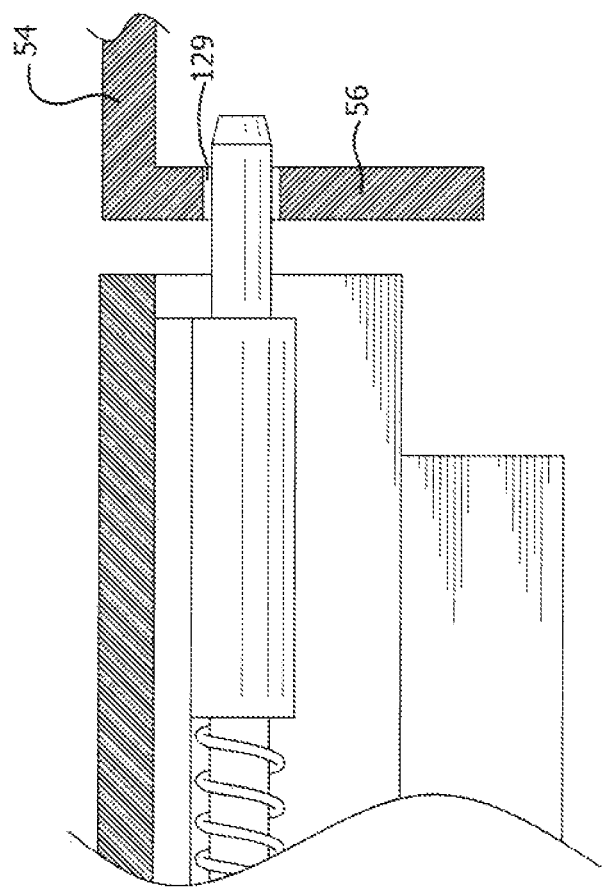
FIG. 3C is a partial cross-sectional view of the brush grommet of FIG. 3B taken through section 3C-3C.
Figure 3B:
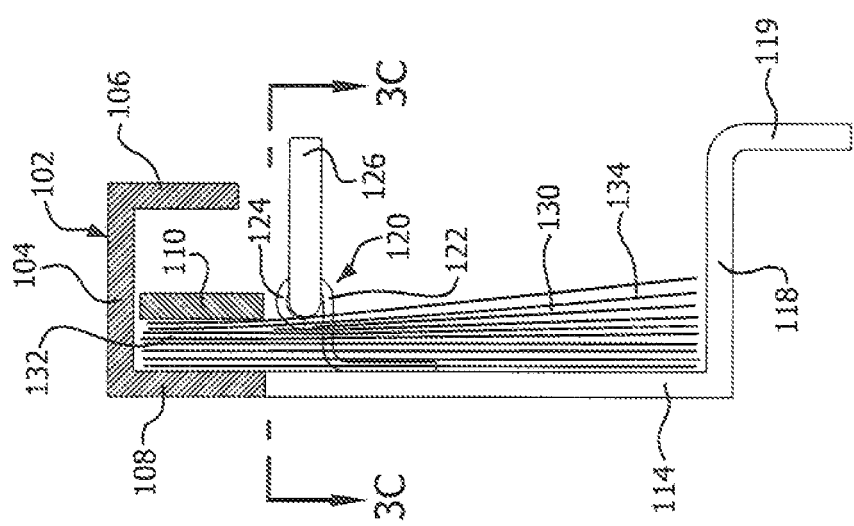
FIG. 3B is a cross-sectional view of the brush grommet of FIG. 3A taken through section 3B-3B.

In one embodiment, the rack assembly 10 includes a brush grommet 100 mounted above the base frame lateral brace 24 for facilitating passage of cabling from outside to inside the rack assembly 10. As depicted in FIGS. 3A-3C, the brush grommet 100 includes a support frame 101 including a support beam 102. A compression bar 110 is arranged to support a plurality of flexible bristles 130 in conjunction with the support beam. The bristles 130 have upper portions 132 that are preferably clamped between the compression bar 110 and the support base 102, although they can be secured in any conventional matter. The bristles 130 also include lower portions 134 that can move freely as the bristles 130 flex, to accommodate cabling and the like while maintaining a neat appearance and generally preventing excess dust and debris from entering the rack assembly 10. The porous nature of the brush grommet 100 also allows flow of air for cooling electronic components that may be mounted in the rack assembly 10. Although not shown, the brush grommet 100 can also be mounted just below the top end of the rack assembly 10 in a similar manner as described herein for the brush grommet mounted just above the bottom of the rack assembly 10.

In the depicted embodiment of the brush grommet 100, the support beam 102 has a U-channel shape, and includes an upper wall 104, an inner wall 106, and an outer wall 108. The upper portions 132 of the bristles 130 may be compressed between the compression bar 110 and either the inner wall 106 or the other wall 108. A side panel 112 extends downward from each end of the support beam 102 to provide a lateral frame for the bristles 130. The side panel 112 includes an outer wall 114 that is coplanar with the outer wall 108 of the support beam 102 and a side wall 116 extending substantially perpendicularly from the outer wall 114 in a rearward direction. The side panel 112 may further include a bottom wall 118 extending substantially perpendicularly from the outer wall 114 in a rearward direction, and a finger tab 119 extending substantially downward from a rear end of the bottom wall 118 to facilitate mounting and removal of the brush grommet 100 in the frame assembly 10. Preferably, the support beam 102 and the side panel 112 are bent from the same sheet of material.

The brush grommet 100 is removably retained in the rack assembly 10 by one or more latch mechanisms 120 mounted to the side panels 112. In the depicted embodiment, the latch mechanism 120 includes a support plate 122 attached to the outer wall 114 of the side panel 112. The support plate 122 is formed to have an aperture 124 therethrough. A latch bar 126 is in slideably mounted through the aperture 124 and extends out both ends. An inner end 125 of the latch bar 126 may be bent to facilitate manual actuation of the latch bar 126. An outer end 127 of the latch bar protrudes laterally outward through an opening in the side wall 116 of the side panel 112.

A spring 128 may be used to bias the latch bar 126 in a laterally outward direction with respect to the mounting plate 122. In a preferred embodiment, a latching mechanism 120 is mounted on each side panel 112 of the brush grommet 100.

When the brush grommet 100 is installed in the rack assembly 10, the bottom walls 118 rest on the top wall 28 of the corresponding lateral, brace 24 with the finger tabs 119 being located spaced apart from the outer wall 26 of the lateral brace 24, and the side walls 116 of the side panels 112 are each positioned opposite the third bracket wall 56 of the corresponding vertical bracket 50. The latch bar 126 is received into an aperture 129 in the third bracket wall 56. To remove the brush grommet 100, the latch bar 126 is actuated against the biasing force of the spring 128 by grasping the inner end 125 of the latch bar 126 to withdraw the latch bar 126 from the aperture 129, so that the frame 101 is free to move with respect to the rack assembly 100.

The structure of an exemplary embodiment of the rack assembly 10, having a corner 80 as described above, includes a base frame 12, a pair of side frames 14, four gussets 70, and a pair of reinforcing brackets 94. The base member 22 of the base frame 12 has a substantially rectangular shape, and a pair of the lateral braces 24 are located on opposite edges 21 of the base member 12. One of the vertical stubs 38 extends substantially perpendicularly upward from each corner 80 of the base member 22. A pair of the support brackets 36 are located on opposite edges 23 of the base member 22 so as to be substantially perpendicular to the pair of lateral braces 24.

The base frame 12, the side frames 14, and the gussets 70 are assembled together to form the rack assembly 10 having four corners 80. In each corner 80, the bottom end 84 of the gusset 70 rests on the base member 22 of the base frame 12, and the vertical stub 38 in each corner 80 of the base frame 12 is received into the first and second gaps 96, 98 between the side frame vertical bracket 38 and the lower portion 80 of the gusset 70. When the upper portion 86 of each reinforcing bracket 94 is attached to the corresponding horizontal frame member 64 of the side frame 14, a gap is formed between the lower portion 88 of the reinforcing bracket 94 and the horizontal frame member 64 for receiving the corresponding support bracket 36 of the base member 22. When the base frame 12, the side frames 14, and the gussets 70 are assembled together, the third gusset wall 76 of each gusset 70 extends below an end 57 of the third bracket wall 56 of the corresponding vertical bracket 50 and contacts one or both of the base member 22 and the corresponding lateral brace 26 of the base frame 12.

In a preferred embodiment in which the rack assembly 10 is made from sheet metal material, the base frame 12, each of the side frames 14, and each of the gussets 70 is bent from a single sheet of material. In particular, the lateral braces 24 are bent to extend substantially perpendicularly upward along opposite first edge 21 of the base member 22, and the vertical stubs 38 are bent to extend substantially perpendicularly upward from each of the corners 80 of the base member 22. The second stub wall 42 of the vertical stub 38 is bent to extend substantially perpendicularly along an edge of the first stub wall 40 so that the first stub wall 40 is substantially aligned with one of the first edge 21 of the base member 22 and the second stub wall 42 is substantially aligned with one of the second edge 23 of the base member 22. The horizontal support member 64 and the vertical brackets 50 of each side frame 14 are formed from the same sheet of material by bending. Similarly, each generally U-shaped gusset 70 is formed form a single sheet of material by bending.

To assemble the rack assembly 10, the upper portion 78 of the first gusset wall 74 is attached to the vertical bracket 50 so as to form a first gap 96 between the second gusset wall 72 and the first bracket wall 52 of the vertical bracket 50 for receiving the first stub wall 40 of the vertical stub 38 of the base frame 12. As a result of the placement of the gusset 70 relative to the vertical bracket 40, a second gap 98 is formed between the second bracket wall 54 and the lower portion 80 of the first gusset wall 74. The gap 98 is sized to receive the second stub wall 42 of the vertical stub 38. To insert the stub walls 40, 42 into the gaps 96, 98, the stub walls 40, 42 are aligned with gaps 96, 98, respectively between the gusset 70 and the vertical bracket 50. Then, with the base frame 12 resting on a supporting surface such as a floor, the side frame 14 is lowered as the stub walls 40, 42 are received into the gaps 96, 98. Eventually, the gusset 70 contacts the base member 22 of the base frame 12, supporting the weight of the side frame 14 with the vertical stub 38 securely held in two directions between the gusset 70 and the vertical bracket 50.

For additional strength and stability to the rack assembly 10, the side frame 14 includes the horizontal frame member 64 extending laterally from a lower portion of the first bracket wall 52 of the vertical bracket 50. In addition, the base frame 12 includes the support bracket 36 extending perpendicularly upward along the second edge 23 of the base member 22. As shown in FIGS. 2A-2C, the support bracket 36 and the horizontal frame member 64 run generally parallel to each other when the frame assembly 10 is assembled. The reinforcing bracket 94 is attached at its upper portion 86 to the horizontal frame member 64. Because the lower portion 88 of the reinforcing bracket 94 is substantially parallel to and offset with respect to the upper portion 86, a gap (not shown) is formed between the lower portion 88 of the reinforcing bracket 94 and the horizontal frame member 64. During assembly, the base end support bracket 36 of the base frame 12 is received into the gap.

As described above, the vertical bracket 50 may further include a third bracket wall 56 extending substantially perpendicularly from the second bracket wall 54 and located opposite and substantially parallel to the first bracket wall 52, such that the vertical bracket 50 forms a generally U-shaped channel. In combination with the generally U-shaped vertical bracket 50, the gusset 70 may include a third gusset wall 76 extending substantially perpendicularly from the first gusset wall 74 and located opposite and substantially parallel to the second gusset wall 72, such that the gusset 70 forms a generally U-shaped channel. When the corner 80 is assembled by bringing together the base frame 12, the side frame 14, and the gusset 70, the third gusset wall 76 extends below an end of the third bracket wall 56 and contacts one or both of the base member 22 and the lateral brace 24 of the base frame 12.

In one embodiment described above, the base frame lateral brace 24 may include a lateral wall 26 extending substantially perpendicularly upward from the base member 22 and a top wall 28 extending substantially perpendicularly from the lateral wall 26 so as to be substantially parallel to and positioned opposed to at least a portion of the base member 22. To further secure the side frame 14 to the base frame 12, the slot 34 near an end of the top wall 28 adjacent to the corner 80 receives the downwardly protruding tab 62 formed at the bottom end 57 of the third bracket wall 56 of the side frame vertical bracket 50.

It is also contemplated that the top corners of the frame could be constructed similarly to the bottom corner construction.

While the invention has been disclosed with reference to certain preferred embodiments, numerous modifications, alterations, and changes to the described embodiments are possible without departing from the sphere and scope of the invention, as defined in the appended claims and equivalents thereof. Accordingly, it is intended that the invention not be limited to the described embodiments, but that it have the full scope defined by the language of the following claims.

What is claimed is:

1. A rack assembly comprising:
a base frame including a base member, a lateral brace extending substantially perpendicularly upward along a first edge of the base member and having an uppermost edge, and a vertical stub extending substantially perpendicularly upward from a corner of the base member to an upper end above the uppermost edge of the lateral brace, the vertical stub including a first stub wall and a second stub wall oriented substantially perpendicularly to each other at the corner of the base frame;
a side frame including a vertical bracket having a first bracket wall and a second bracket wall substantially perpendicular to the first bracket wall; and
a gusset having a first gusset wall, the first gusset wall having an upper portion and a lower portion in which the lower portion of the first gusset wall is offset from the upper portion such that the upper portion and lower portion lie in substantially parallel planes, the upper portion of the first gusset wall attached to the vertical bracket so as to form a first gap between the gusset and the first bracket wall of the vertical bracket for receiving one of the stub walls of the vertical stub of the base frame, and a second gap between the second bracket wall and the lower portion of the first gusset wall for receiving the other of the stub walls of the vertical stub of the base frame;
wherein the base frame, the side frame, and the gusset are assembled together to form a corner of the rack assembly in which the vertical stub of the base frame is received into the first and second gaps between the side frame vertical bracket and the lower portion of the gusset.

2. The rack assembly of claim 1, further comprising:
a horizontal frame member extending laterally from a lower portion of the first bracket wall of the vertical bracket of the side frame;
a support bracket extending perpendicularly upward along a second edge of the base member of the base frame, the second edge being substantially perpendicular to the first edge; and
a reinforcing bracket having an upper portion and a lower portion offset with respect to the upper portion such that the upper portion and lower portion lie in substantially parallel planes;
wherein when the upper portion of the reinforcing bracket is attached to the horizontal frame member, a gap is formed between the lower portion of the reinforcing bracket and the horizontal frame member for receiving the support bracket of the base frame.

3. A rack assembly comprising:
a base frame including a base member, a lateral brace extending substantially perpendicularly upward along a first edge of the base member, and a vertical stub extending substantially perpendicularly upward from a corner of the base member, the vertical stub including a first stub wall and a second stub wall oriented substantially perpendicularly to each other at the corner of the base frame;
a side frame including a vertical bracket having a first bracket wall and a second bracket wall substantially perpendicular to the first bracket wall; and
a gusset having a first gusset wall, the first gusset wall having an upper portion and a lower portion in which the lower portion of the first gusset wall is offset from the upper portion such that the upper portion and lower portion lie in substantially parallel planes, the upper portion of the first gusset wall attached to the vertical bracket so as to form a first gap between the gusset and the first bracket wall of the vertical bracket for receiving one of the stub walls of the vertical stub of the base frame, and a second gap between the second bracket wall and the lower portion of the first gusset wall for receiving the other of the stub walls of the vertical stub of the base frame;
wherein the gusset includes a second gusset wall extending substantially perpendicular to the first gusset wall, and wherein the first gap is formed between the second gusset wall and the first bracket wall of the vertical bracket; and
wherein the base frame, the side frame, and the gusset are assembled together to form a corner of the rack assembly in which the vertical stub of the base frame is received into the first and second gaps between the side frame vertical bracket and the lower portion of the gusset.

4. The rack assembly of claim 3,
wherein the vertical bracket further includes a third bracket wall extending substantially perpendicular to the second bracket wall and located opposite and substantially parallel to the first bracket wall, such that the vertical bracket forms a generally U-shaped channel;
wherein the gusset further includes a third gusset wall extending substantially perpendicular to the first gusset wall and located opposite and substantially parallel to the second gusset wall, such that the gusset forms a generally U-shaped channel; and
wherein when the base frame, the side frame, and the gusset are assembled together, the third gusset wall extends below an end of the third bracket wall.

5. The rack assembly of claim 4,
wherein the base frame lateral brace includes a lateral wall extending substantially perpendicularly upward from the base member and a top wall extending substantially perpendicularly from the lateral wall so as to be substantially parallel to and positioned opposed to at least a portion of the base member.

6. The rack assembly of claim 5,
wherein the base frame lateral brace further includes a lip extending substantially perpendicularly from the top wall and toward the base member.

7. The rack assembly of claim 5, further comprising:
a brush grommet mounted above the base frame lateral brace for facilitating passage of cabling from outside to inside the rack assembly.

8. The rack assembly of claim 7,
wherein the brush grommet includes:
a support frame;
a latch mechanism for removably securing the support frame to the side frame vertical bracket;
a plurality of flexible bristles; and
a compression bar;
wherein the compression bar is adapted to compress upper portions of the bristles against the support beam while allowing lower portions of the bristles to move freely as the bristles flex.

9. The rack assembly of claim 2, further comprising:
a cross rail extending between the vertical bracket and an adjacent vertical bracket, the cross rail including a structure for receiving at least one fixture for securing a component to the cross rail.

10. The rack assembly of claim 9, wherein the structure of the cross rail for receiving at least one fixture includes a mounting portion having a longitudinal slot sized to capture the fixture and an enlarged opening in the longitudinal slot sized to permit installation and removal of the fixture into and from the slot, respectively.

11. The rack assembly of claim 9, wherein the structure of the cross rail for receiving at least one fixture includes a generally U-shaped mounting portion having a front panel, an outer leg, and an inner leg, the outer leg having a first opening sized to receive an anchor of the fixture, the inner leg having a second opening sized to receive a tab extending outwardly from an end of a body the anchor but to prevent passage of the body of the anchor, and the front panel having a hole aligned with the first and second openings so as to enable insertion of a fastener into a threaded hole in the body of the anchor to secure the fixture in the mounting portion.

12. The rack assembly of claim 9, further comprising a fixture including:
    an anchor having a body, a tab extending outwardly from each end of the body, and a threaded hole through the body; and
    a fastener having a head and a threaded shank extending from the head, the threaded shank being configured to be received into the threaded hole in the anchor.

13. The rack assembly of claim 9, wherein the structure of the cross rail for receiving at least one fixture includes a mounting portion having an opening sized to receive a locking lever at an end of a rack rail.

14. The rack assembly of claim 13, further comprising:
    a rack rail including a locking lever, the locking lever comprising:
    a base plate adapted to be affixed to or incorporated into a rack rail;
    a body plate mounted to the base plate so as to be pivotable about a pivot point between a first position and a second position with respect to the base plate;
    a tang protruding from the body plate;
    a spring biasing the body plate toward the first position with respect to the base plate when the body plate is in the second position; and
    a finger tab extending from the body plate for actuating the body plate to pivot about the pivot point with respect to the base plate;
    wherein when the body plate is in the second position with respect to the base plate, the tang is at least partially recessed with respect to the base plate so that an end portion of the locking lever has a size at least slightly smaller than the size of the opening on the mounting portion of the cross rail, to enable insertion of the end portion into the opening;
    wherein when the body plate is in the first position with respect to the base plate, the tang extends beyond the base plate so that the end portion of the locking lever has a size at least slightly larger than the size of the opening on the mounting portion of the cross rail, to prevent removal of the end portion from the slot;
    wherein the tang and the finger tab are located on the same side of the pivot point; and
    wherein the tang includes a sloped front surface such that when the end portion of the locking lever is inserted into the opening on the mounting portion of the cross rail, the sloped front surface of the tang is adapted to contact the mounting portion adjacent to the opening, thereby causing the body plate to pivot to the second position with respect to the base plate and allowing the end portion of the locking lever to be inserted into the opening.

15. A rack assembly comprising:
    a base frame including:
    a base member having a substantially rectangular shape;
    a pair of lateral braces located on opposite edges of the base member, each lateral brace having a lateral wall extending substantially perpendicularly upward from the base member, a top wall extending substantially perpendicularly from the lateral wall so as to be substantially parallel to and positioned opposed to at least a portion of the base member, and a lip extending substantially perpendicularly from the top wall and toward the base member;
    four vertical stubs, including a vertical stub extending substantially perpendicularly upward from each corner of the base member, each vertical stub including a first stub wall and a second stub wall bent substantially perpendicularly along an edge of the first stub wall; and
    a pair of support brackets located on opposite edges of the base member and substantially perpendicular to the pair of lateral braces, each support bracket extending perpendicularly upward from the base member;
    a pair of side frames, each side frame including a horizontal frame member extending laterally between lower portions of two vertical brackets, each vertical bracket having a first bracket wall, a second bracket wall extending substantially perpendicularly along an edge of the first bracket wall, a third bracket wall extending substantially perpendicularly along an edge of the second bracket wall and located opposite and substantially parallel to the first bracket wall such that the vertical bracket forms a generally U-shaped channel;
    four gussets, each gusset having a first gusset wall, a second gusset wall extending substantially perpendicular to the first gusset wall, and a third gusset wall extending substantially perpendicular to the first gusset wall and located opposite and substantially parallel to the second gusset wall, such that the gusset forms a generally U-shaped channel, the first gusset wall having an upper portion and a lower portion in which the lower portion of the first gusset wall is offset from the upper portion such that the upper portion and lower portion lie in substantially parallel planes, such that when the upper portion of the first gusset wall is attached to a corresponding vertical bracket a first gap is formed between the second gusset wall and the first bracket wall of the vertical bracket for receiving one of the stub walls of a corresponding vertical stub of the base frame, and a second gap is formed between the second bracket wall and the lower portion of the first gusset wall for receiving the other of the stub walls of the corresponding vertical stub of the base frame; and
    a pair of reinforcing brackets each having an upper portion, and a lower portion offset with respect to the upper portion such that the upper portion and lower portion lie in substantially parallel planes;
    wherein the base frame, the side frames, and the gussets are assembled together to form the rack assembly having four corners, wherein in each corner the vertical stub of the base frame is received into the first and second gaps between the side frame vertical bracket and the lower portion of the first gusset wall;
    wherein the upper portion of each reinforcing bracket is attached to a corresponding horizontal frame member such that a gap is formed between the lower portion of the reinforcing bracket and the horizontal frame member for receiving a corresponding support bracket of the base member; and wherein when the base frame, the side frames, and the gussets are assembled together, the third gusset wall of each gusset extends below an end of the third bracket wall of the corresponding vertical bracket.

16. The rack assembly of claim 15, further comprising:
a brush grommet mounted above one of the base frame lateral braces for facilitating passage of cabling from outside to inside the rack assembly.

17. The rack assembly of claim 16,
wherein the brush grommet includes:
a support frame;
a latch mechanism for removably securing the support frame to one of the vertical brackets;
a plurality of flexible bristles; and
a compression bar;
wherein the compression bar is adapted to compress upper portions of the bristles against the support beam while allowing lower portions of the bristles to move freely as the bristles flex.

18. The rack assembly of claim 15, further comprising:
a cross rail extending between the vertical bracket and an adjacent vertical bracket, the cross rail including a structure for receiving at least one fixture for securing a component to the cross rail.

19. The rack assembly of claim 18, wherein the structure of the cross rail for receiving at least one fixture includes a mounting portion having a longitudinal slot sized to capture the fixture and an enlarged opening in the longitudinal slot sized to permit installation and removal of the fixture into and from the slot, respectively.

20. The rack assembly of claim 18, wherein the structure of the cross rail for receiving at least one fixture includes a generally U-shaped mounting portion having a front panel, an outer leg, and an inner leg, the outer leg having a first opening sized to receive an anchor of the fixture, the inner leg having a second opening sized to receive a tab extending outwardly from an end of a body the anchor but to prevent passage of the body of the anchor, and the front panel having a hole aligned with the first and second openings so as to enable insertion of a fastener into a threaded hole in the body of the anchor to secure the fixture in the mounting portion.

21. The rack assembly of claim 18, further comprising a fixture including:
an anchor having a body, a tab extending outwardly from each end of the body, and a threaded hole through the body; and
a fastener having a head and a threaded shank extending from the head, the threaded shank being configured to be received into the threaded hole in the anchor.

22. The rack assembly of claim 18, wherein the structure of the cross rail for receiving at least one fixture includes a mounting portion having an opening sized to receive a locking lever at an end of a rack rail.

23. The rack assembly of claim 22, further comprising:
a rack rail including a locking lever, the locking lever comprising:
a base plate adapted to be affixed to or incorporated into a rack rail;
a body plate mounted to the base plate so as to be pivotable about a pivot point between a first position and a second position with respect to the base plate;
a tang protruding from the body plate;
a spring biasing the body plate toward the first position with respect to the base plate when the body plate is in the second position; and
a finger tab extending from the body plate for actuating the body plate to pivot about the pivot point with respect to the base plate;
wherein when the body plate is in the second position with respect to the base plate, the tang is at least partially recessed with respect to the base plate so that an end portion of the locking lever has a size at least slightly smaller than the size of the opening on the mounting portion of the cross rail, to enable insertion of the end portion into the opening;
wherein when the body plate is in the first position with respect to the base plate, the tang extends beyond the base plate so that the end portion of the locking lever has a size at least slightly larger than the size of the opening on the mounting portion of the cross rail, to prevent removal of the end portion from the slot;
wherein the tang and the finger tab are located on the same side of the pivot point; and
wherein the tang includes a sloped front surface such that when the end portion of the locking lever is inserted into the opening on the mounting portion of the cross rail, the sloped front surface of the tang is adapted to contact the mounting portion adjacent to the opening, thereby causing the body plate to pivot to the second position with respect to the base plate and allowing the end portion of the locking lever to be inserted into the opening.

* * * * *